United States Patent
Ito et al.

(10) Patent No.: US 10,389,391 B2
(45) Date of Patent: Aug. 20, 2019

(54) ACOUSTIC WAVE RESONATOR, ACOUSTIC WAVE FILTER, MULTIPLEXER, AND COMMUNICATION APPARATUS

(71) Applicant: KYOCERA Corporation, Kyoto-shi, Kyoto (JP)

(72) Inventors: Motoki Ito, Kyoto (JP); Tetsuya Kishino, Kyoto (JP); Tsuyoshi Nakai, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/072,585

(22) PCT Filed: Jan. 27, 2017

(86) PCT No.: PCT/JP2017/002974
§ 371 (c)(1),
(2) Date: Jul. 25, 2018

(87) PCT Pub. No.: WO2017/131170
PCT Pub. Date: Aug. 3, 2017

(65) Prior Publication Data
US 2019/0036554 A1    Jan. 31, 2019

(30) Foreign Application Priority Data

Jan. 29, 2016  (JP) ................................ 2016-016102

(51) Int. Cl.
*H03H 3/08*   (2006.01)
*H04B 1/00*   (2006.01)
(Continued)

(52) U.S. Cl.
CPC ....... *H04B 1/0057* (2013.01); *H03H 9/02637* (2013.01); *H03H 9/02685* (2013.01);
(Continued)

(58) Field of Classification Search
CPC combination set(s) only.
See application file for complete search history.

(56) References Cited

U.S. PATENT DOCUMENTS 6,259,336 B1 *  7/2001  Ichikawa ............. H03H 9/6433
                                                    310/313 B
6,346,864 B1 *  2/2002  Kadota ................ H03H 9/0038
                                                    310/313 B
(Continued)

FOREIGN PATENT DOCUMENTS

JP    H11-88112 A      3/1999
JP    2012-156741 A    8/2012
(Continued)

*Primary Examiner* — Cindy Trandai
(74) *Attorney, Agent, or Firm* — Procopio Cory Hargreaves and Savitch LLP

(57) ABSTRACT

An SAW resonator includes a piezoelectric substrate, an IDT electrode, and a pair of reflectors. The IDT electrode includes pluralities of electrode fingers which are aligned on the piezoelectric substrate in a direction of propagation of a SAW. The pair of reflectors are located on the two sides of the pluralities of electrode fingers on the piezoelectric substrate in the direction of propagation. The IDT electrode includes a plurality of areas which includes pluralities of electrode fingers distributed to them and have different resonance frequencies from each other. The plurality of areas include at least three areas. The second highest resonance frequency among all areas is lower than an intermediate value between the lowest resonance frequency among all areas and the highest resonance frequency among all areas.

16 Claims, 15 Drawing Sheets

(51) Int. Cl.
*H03H 9/02* (2006.01)
*H03H 9/145* (2006.01)
*H03H 9/25* (2006.01)
*H03H 9/64* (2006.01)
*H03H 9/72* (2006.01)

(52) U.S. Cl.
CPC .... *H03H 9/02929* (2013.01); *H03H 9/14582* (2013.01); *H03H 9/25* (2013.01); *H03H 9/6483* (2013.01); *H03H 9/725* (2013.01); *H03H 9/02559* (2013.01)

(56) References Cited

U.S. PATENT DOCUMENTS

| | | | | |
|---|---|---|---|---|
| 6,438,243 | B1* | 8/2002 | Ikeuchi | H04R 15/02 367/181 |
| 6,816,036 | B2* | 11/2004 | Takamine | H03H 9/0042 310/313 B |
| 7,154,360 | B2* | 12/2006 | Wada | H03H 9/02779 333/194 |
| 7,579,932 | B2* | 8/2009 | Takagi | H03H 9/0042 310/313 B |
| 2002/0017969 | A1* | 2/2002 | Takamine | H03H 9/0042 333/193 |
| 2002/0153969 | A1* | 10/2002 | Inoue | H03H 9/14526 333/195 |
| 2003/0227359 | A1* | 12/2003 | Ouchi | H03H 9/0038 333/193 |
| 2004/0108918 | A1* | 6/2004 | Tsunekawa | H03H 9/0028 333/195 |
| 2004/0222870 | A1* | 11/2004 | Ueda | H03H 9/0071 333/195 |
| 2004/0233018 | A1* | 11/2004 | Watanabe | H03H 9/0038 333/193 |
| 2006/0244550 | A1* | 11/2006 | Inoue | H03H 9/0038 333/133 |
| 2007/0069837 | A1* | 3/2007 | Nishimura | H03H 9/0274 333/195 |
| 2007/0139282 | A1* | 6/2007 | Haruyama | H01Q 1/243 343/702 |
| 2009/0206954 | A1* | 8/2009 | Hashimoto | H03H 9/02992 333/195 |
| 2010/0219913 | A1* | 9/2010 | Yamanaka | H03H 9/02551 333/195 |
| 2011/0199160 | A1* | 8/2011 | Yamanaka | H03H 9/02551 331/155 |
| 2012/0188026 | A1 | 7/2012 | Yamaji et al. | |
| 2012/0218052 | A1* | 8/2012 | Tsurunari | H03H 9/02559 333/133 |
| 2012/0274421 | A1* | 11/2012 | Hara | H03H 7/38 333/195 |
| 2014/0049341 | A1* | 2/2014 | Komatsu | H03H 9/14588 333/187 |
| 2014/0070906 | A1* | 3/2014 | Ikeuchi | H03H 9/643 333/195 |
| 2015/0070227 | A1* | 3/2015 | Kishino | H03H 9/725 343/722 |
| 2015/0180450 | A1 | 6/2015 | Yamaji et al. | |
| 2015/0288346 | A1* | 10/2015 | Nakamura | H03H 9/205 333/133 |
| 2016/0056791 | A1 | 2/2016 | Shimizu et al. | |
| 2016/0380176 | A1* | 12/2016 | Kishino | H03H 9/14517 370/282 |
| 2017/0059405 | A1* | 3/2017 | Huang | G01J 3/0205 |
| 2018/0123565 | A1* | 5/2018 | Takamine | H03H 9/145 |

FOREIGN PATENT DOCUMENTS

JP 2015-73207 A 4/2015
WO 2015/080278 A1 6/2015

* cited by examiner

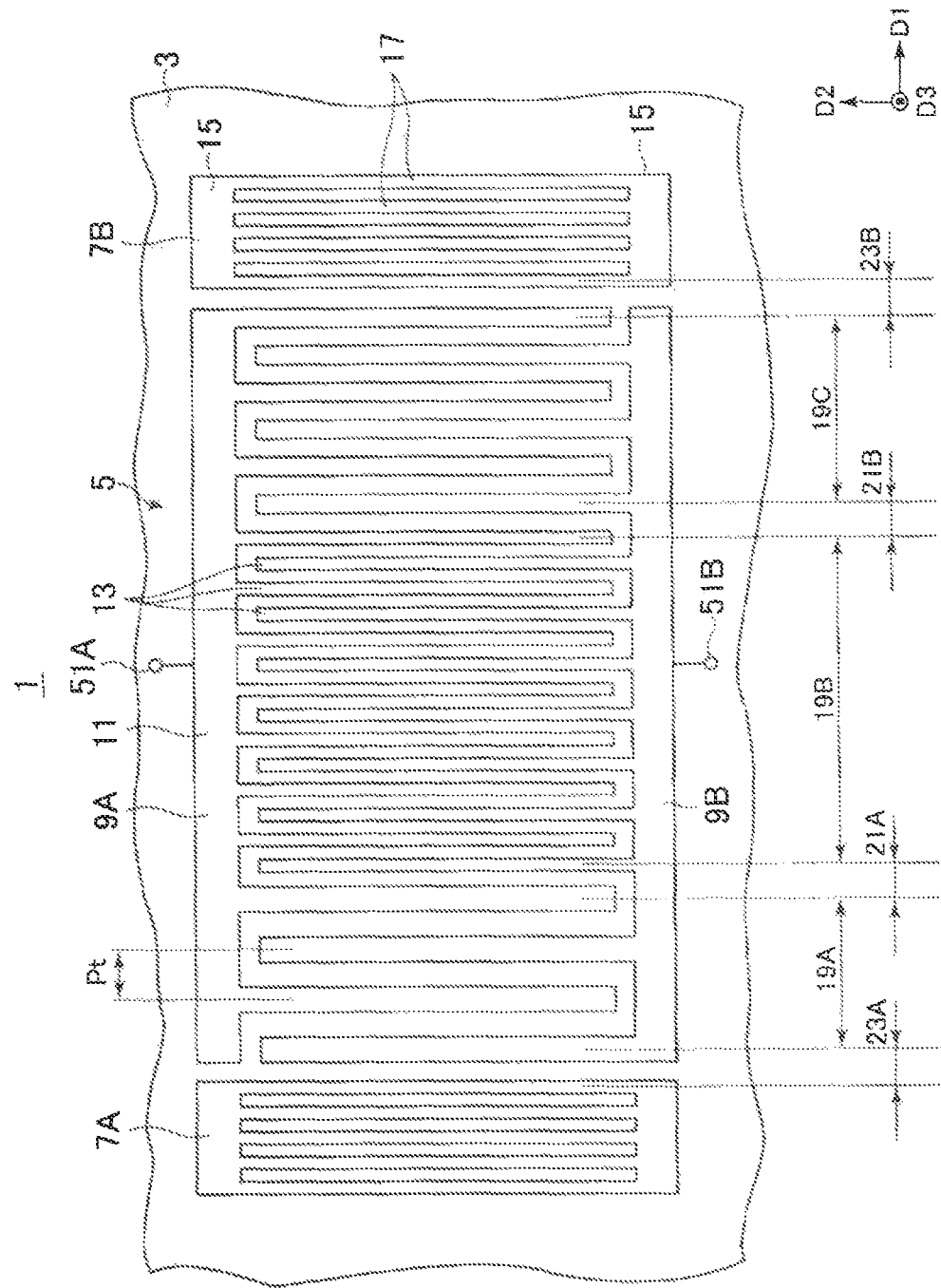

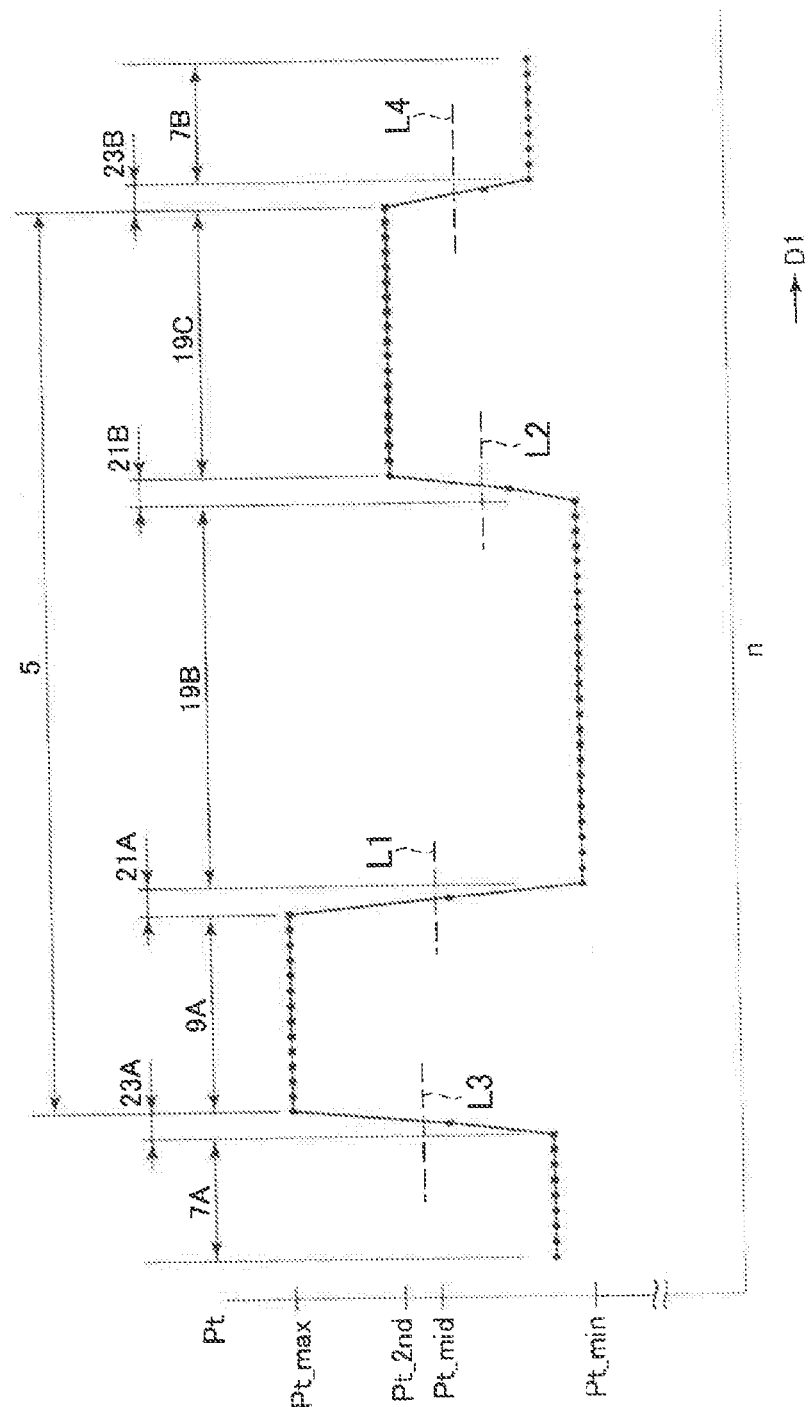

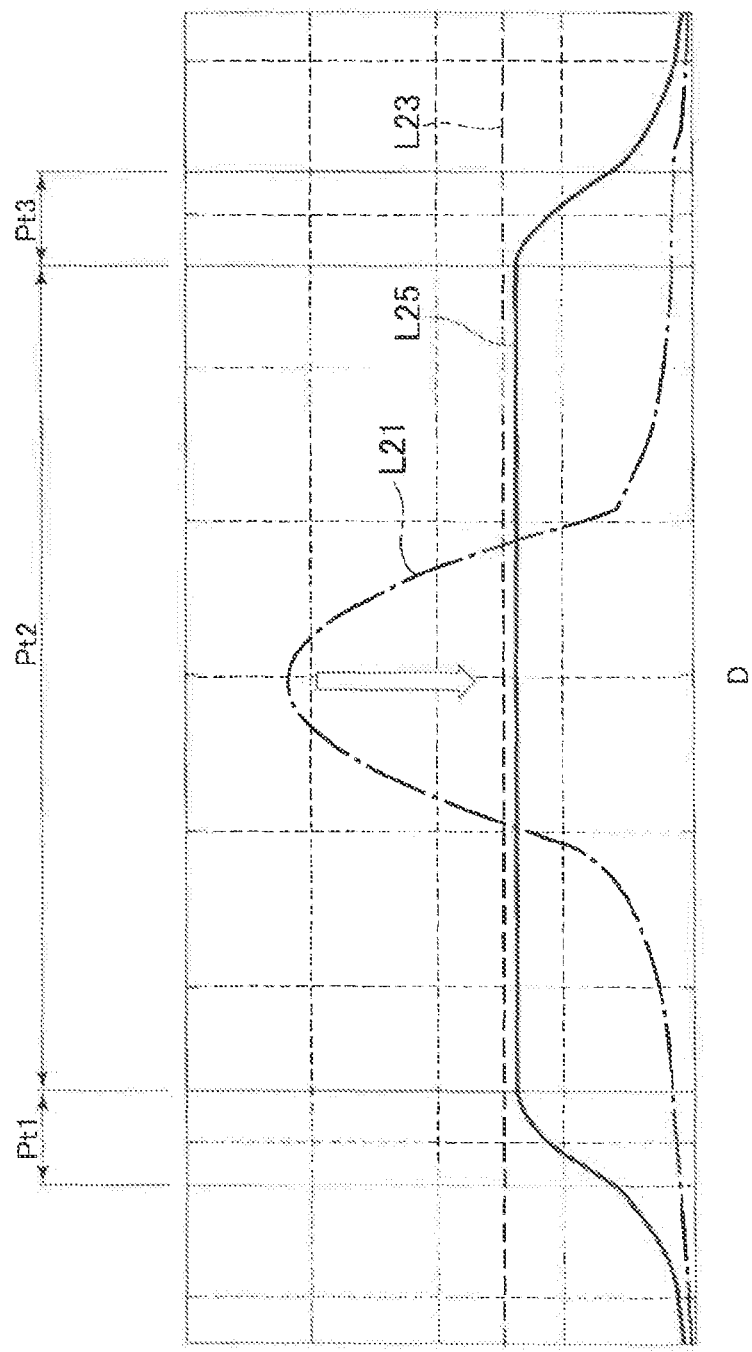

FIG. 5

| MODEL | CONTENTS | COMPUTATION RESULTS | | |
|---|---|---|---|---|
| | | NARROWER $\Delta f$ | RESONANCE SIDE | ANTIRESONANCE SIDE |
| Ca1 | STANDARD | ○ | REFERENCE | REFERENCE |
| Ca2 | Pt_R1×0.9 | ○ | — | IMPROVED |
| Ca3 | Pt_R1×1.1 | ○ | — | — |
| Ca4 | Pt_R2×0.9 | ○ | — | IMPROVED |
| Ca5 | Pt_R2×1.1 | ○ | — | — |
| Ca6 | Pt_R1/R2×0.9 | ○ | — | IMPROVED |
| Ca7 | Pt_R1/R2×1.1 | ○ | — | — |
| Ca8 | Pt_I1×0.9 | ○ | IMPROVED | — |
| Ca9 | Pt_I1×1.1 | ○ | — | — |
| Ca10 | Pt_I2×0.9 | ○ | IMPROVED | — |
| Ca11 | Pt_I2×1.1 | ○ | — | — |
| Ca12 | Pt_I1/I2×0.9 | ○ | IMPROVED | — |
| Ca13 | Pt_I1/I2×1.1 | ○ | — | IMPROVED |
| Ca14 | Pt_I1×0.9+Pt_I2×1.1 | ○ | — | — |
| Ca15 | Pt_I1×1.1+Pt_I2×0.9 | ○ | — | — |
| Ca16 | Pt_R1/R2/I1/I2×0.9 | ○ | IMPROVED | IMPROVED |
| Ca17 | Pt_R1/R2/I1/I2×1.1 | ○ | — | — |
| Ca18 | Pt_R1/R2×0.9+Pt_I1/I2×1.1 | ○ | — | IMPROVED |
| Ca19 | Pt_R1/R2×1.1+Pt_I1/I2×0.9 | ○ | IMPROVED | — |

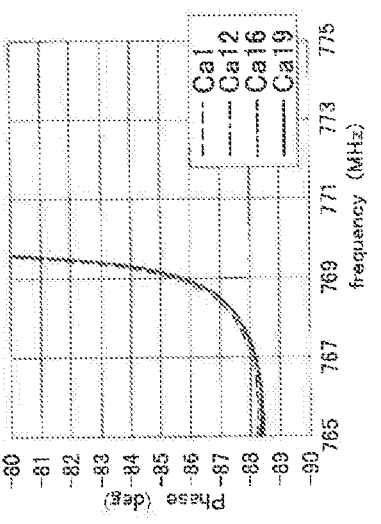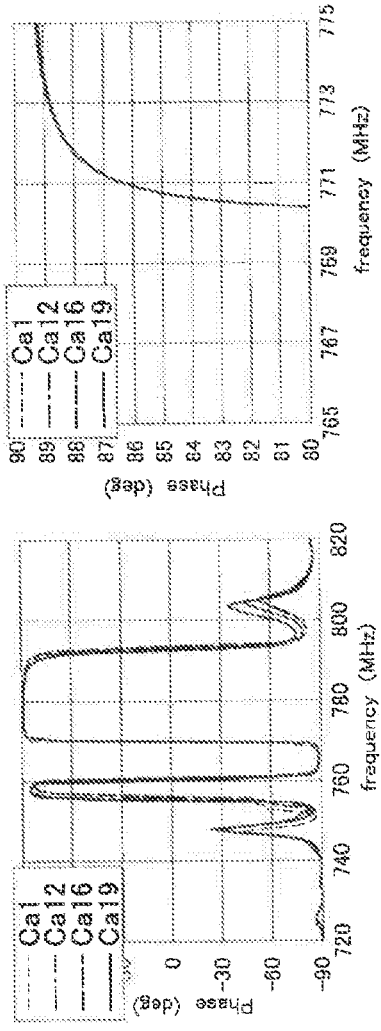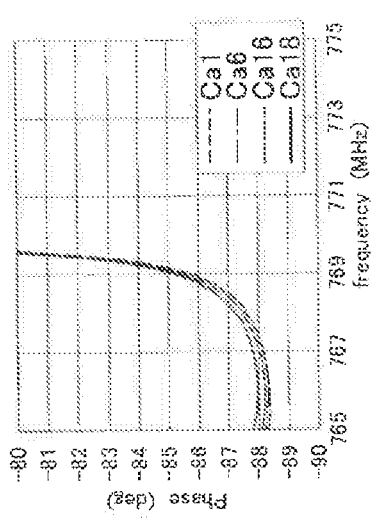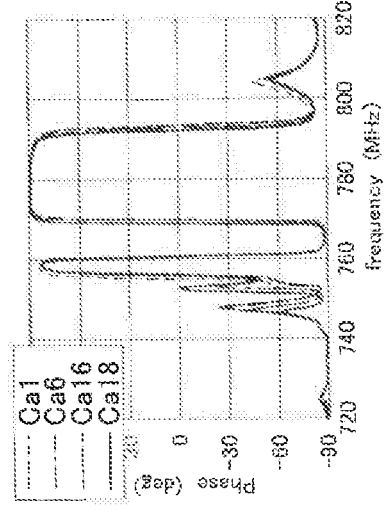

FIG. 7

| MODEL | CONTENTS | COMPUTATION RESULTS | | |
|---|---|---|---|---|
| | | NARROWER Δf | RESONANCE SIDE | ANTIRESONANCE SIDE |
| Cb1 | STANDARD | ○ | REFERENCE | REFERENCE |
| Cb2 | Pt_R1/R2×0.9 | ○ | — | IMPROVED |
| Cb3 | Pt_R1/R2×0.8 | ○ | — | IMPROVED |
| Cb4 | Pt_R1/R2×0.7 | ○ | — | IMPROVED |
| Cb5 | Pt_I1/I2×0.9 | ○ | IMPROVED | — |
| Cb6 | Pt_I1/I2×0.8 | ○ | — | — |
| Cb7 | Pt_I1/I2×0.7 | ○ | — | — |
| Cb8 | Pt_R1/R2×0.9+Pt_I1/I2×0.9 | ○ | IMPROVED | IMPROVED |
| Cb9 | Pt_R1/R2×0.8+Pt_I1/I2×0.8 | ○ | — | IMPROVED |
| Cb10 | Pt_R1/R2×0.7+Pt_I1/I2×0.7 | ○ | — | IMPROVED |
| Cb11 | Pt_R1/R2×0.9+Pt_I1/I2×1.1 | ○ | — | IMPROVED |
| Cb12 | Pt_R1/R2×0.8+Pt_I1/I2×1.2 | ○ | — | IMPROVED |
| Cb13 | Pt_R1/R2×0.7+Pt_I1/I2×1.3 | ○ | — | IMPROVED |
| Cb14 | Pt_R1/R2×1.1+Pt_I1/I2×0.9 | ○ | IMPROVED | — |
| Cb15 | Pt_R1/R2×1.2+Pt_I1/I2×0.8 | ○ | — | — |
| Cb16 | Pt_R1/R2×1.3+Pt_I1/I2×0.7 | ○ | — | — |

…

ACOUSTIC WAVE RESONATOR, ACOUSTIC WAVE FILTER, MULTIPLEXER, AND COMMUNICATION APPARATUS

TECHNICAL FIELD

This disclosure relates to an acoustic wave resonator, an acoustic wave filter, a multiplexer, and a communication apparatus utilizing a surface acoustic wave (SAW) or other acoustic wave.

BACKGROUND ART

Known in the art is an acoustic wave resonator having a piezoelectric substrate and an IDT (InterDigital Transducer) electrode provided on a major surface (the broadest surface of a plate-shaped member (front surface or back surface)) of the piezoelectric substrate (for example, Patent Literatures 1 to 3). The IDT electrode has a pair of comb-shaped electrodes. Each of the comb-shaped electrodes has pluralities of electrode fingers which extend parallel to each other. The pair of comb-shaped electrodes are provided so that their electrode fingers are alternately aligned in the direction of propagation of the acoustic wave. That is, the pair of comb-shaped electrodes are provided so that they intermesh with each other.

In the acoustic wave resonator as described above, pitches of the pluralities of electrode fingers (electrode finger pitches) are basically made constant. When voltage is applied to the pair of comb-shaped electrodes, an acoustic wave having the electrode finger pitch as a half wavelength ($\lambda/2$) is excited on the piezoelectric substrate. The frequency of this acoustic wave becomes a resonance frequency (fr). Further, an antiresonance frequency (fa) is defined by the resonance frequency and a capacity ratio ($\gamma$) of the IDT electrode (fa=fr×$\sqrt{(1+1/\gamma)}$). Here, the capacity ratio $\gamma$ of the IDT electrode is represented by a ratio (C1/C0) of C0 representing mechanical vibration when replacing the IDT electrode with an equivalent circuit and an electrostatic capacity C1. The difference between the resonance frequency and the antiresonance frequency ($\Delta f$=fa−fr), for example, when configuring an acoustic wave filter by the acoustic wave resonator, exerts an influence upon the steepness of change of the attenuation amount at a boundary between the passing band and the bandwidth outside of that.

Although particularly not referred to the citations, when desiring to make $\Delta f$ smaller, a capacity element is connected in parallel with respect to the IDT electrode. When such a capacity element is provided, the capacity ratio of the IDT electrode appears to become larger, therefore the antiresonance frequency becomes smaller relative to the resonance frequency. Consequently, $\Delta f$ becomes smaller.

Note that, Patent Literatures 1 to 3 are not arts aimed at reduction of $\Delta f$. These citations propose provision of areas among which electrode finger pitches are different from each other or provision of a narrow pitch part in which the electrode finger pitch is smaller than in other parts in the IDT electrode.

CITATION LIST

Patent Literature

Patent Literature 1: Japanese Patent Publication No. 11-88112A

Patent Literature 2: Japanese Patent Publication No. 2012-156741A

Patent Literature 3: Japanese Patent Publication No. 2015-73207A

SUMMARY OF INVENTION

An acoustic wave resonator according to one aspect of the present disclosure includes a piezoelectric substrate, an IDT electrode, and a pair of reflectors. The IDT electrode includes pluralities of electrode fingers which are aligned on the piezoelectric substrate in a direction of propagation of an acoustic wave. The pair of reflectors are located on the two sides of the pluralities of electrode fingers on the piezoelectric substrate in the direction of propagation. The IDT electrode includes a plurality of areas. The plurality of areas includes pluralities of electrode fingers among the plurality of electrode fingers distributed to them and have different resonance frequencies from each other. Further, the plurality of areas include at least an area having the lowest resonance frequency among all areas, an area having the highest resonance frequency among all areas, and an area having a resonance frequency which is higher than the lowest resonance frequency and is second highest among all areas. The second highest resonance frequency is lower than an intermediate value between the lowest resonance frequency and the highest resonance frequency.

An acoustic wave resonator according to another aspect of the present disclosure includes a piezoelectric substrate, an IDT electrode, and a pair of reflectors. The IDT electrode includes pluralities of electrode fingers which are aligned on the piezoelectric substrate in a direction of propagation of an acoustic wave. The pair of reflectors are located on the two sides of the pluralities of electrode fingers on the piezoelectric substrate in the direction of propagation. The IDT electrode includes a plurality of areas. To each of the plurality of areas, a plurality of electrode fingers among the pluralities of electrode fingers are distributed. In each area, the electrode finger pitch is constant. Among the plurality of areas, the electrode finger pitches are different from each other. Between any two areas which are adjacent to each other among the plurality of areas, an electrode finger in one area at an end part on the other area side and an electrode finger in the other area at an end part on the one area side are two electrode fingers which are adjacent to each other. The electrode finger pitches of these two electrode fingers are different in size from any of the electrode finger pitches of the two areas and are smaller than an intermediate value of the electrode finger pitches of the two areas.

An acoustic wave filter according to one aspect of the present disclosure includes one or more serial resonators and one or more parallel resonators which are connected in a ladder configuration, at least one of the one or more parallel resonators being configured by any acoustic wave resonator described above.

A multiplexer according to one aspect of the present disclosure includes an antenna terminal, a transmission filter filtering a transmission signal and outputting the result to the antenna terminal, and a receiving filter filtering the reception signal from the antenna terminal. At least one of the transmission filter and the receiving filter includes the acoustic wave resonator described above.

A communication apparatus according to one aspect of the present disclosure includes an antenna, the multiplexer described above in which the antenna terminal is connected to the antenna, and an IC which is connected to the transmission filter and the receiving filter.

BRIEF DESCRIPTION OF DRAWINGS

FIG. 1 A plan view showing a SAW resonator according to an embodiment of the present disclosure.

FIG. 2 A schematic view showing a change of electrode finger pitch in the SAW resonator in FIG. 1.

FIG. 4 A graph for explaining an example of setting of sizes of areas in the SAW resonator in FIG. 1.

FIG. 5 A view showing a table of conditions and results of simulation for checking an influence of the pitch outside of the areas exerted upon the characteristics in the SAW resonator in FIG. 1.

FIG. 6A to FIG. 6F are graphs showing phases of impedance for a portion of the results of simulation in FIG. 5.

FIG. 7 A view showing a table of conditions and results of another simulation for checking the influence of the pitch outside of the areas exerted upon the characteristics.

DESCRIPTION OF EMBODIMENTS

Figure 3A:
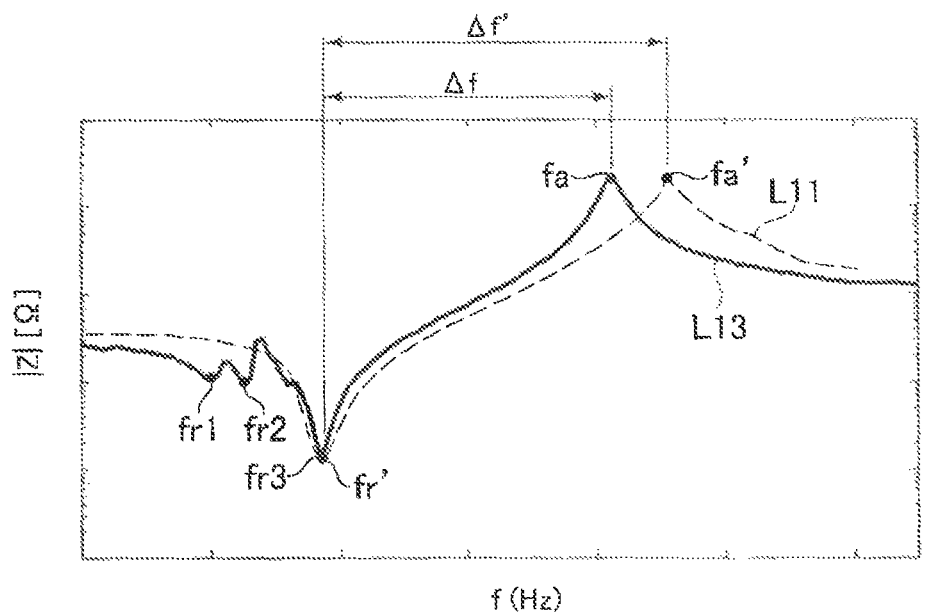
FIG. 3A and FIG. 3B are graphs showing absolute values and phases of impedance of the SAW resonator in FIG. 1.

Below, embodiments in the present disclosure will be explained with reference to the drawings. Note that, the drawings used in the following explanation are schematic ones. Size ratios or the like in the drawings do not always coincide with the actual ones.

For the same or similar configurations, sometimes different letters will be attached to the same terms such as the "first area 19A" and "second area 19B". Further, in this case, sometimes they will be simply referred to as the "areas 19" and will not be distinguished.

<Saw Resonator>

(Fundamental Configuration)

FIG. 1 is a plan view showing the configuration of a SAW resonator 1 according to an embodiment of the present disclosure.

In the SAW resonator 1, any direction may be defined as "above" or "below". In the following explanation, however, for convenience, an orthogonal coordinate system comprised of a D1-axis, D2-axis, and D3-axis will be defined, and sometimes use will be made of "upper surface" or other terms defining the positive side of the D3-axis (this side on the paper surface in FIG. 1) as "above". Note that, the D1-axis is defined so as to be parallel to the direction of propagation of the SAW propagating along the upper surface (the surface on this side of the paper surface. Usually, the major surface) of the piezoelectric substrate 3 which will be explained later. The D2-axis is defined so as to be parallel to the upper surface of the piezoelectric substrate 3 and perpendicular to the D1-axis, and the D3-axis is defined so as to be perpendicular to the upper surface of the piezoelectric substrate 3.

The SAW resonator 1 configures a so-called 1-port SAW resonator. For example, when an electrical signal having a predetermined frequency is input from one of the substantially shown first terminal 51A and second terminal 51B, resonance is generated and a signal with resonance is output from the other of the first terminal 51A and second terminal 51B. Note that, bus bars or wirings extending from the bus bars which will be explained later may function as the terminals 51 as well.

The SAW resonator 1 configuring such a 1-port SAW resonator has for example a piezoelectric substrate 3, an IDT electrode 5 provided on the piezoelectric substrate 3, and a first reflector 7A and second reflector 7B positioned on the two sides of the IDT electrode 5.

The piezoelectric substrate 3 is for example made of a single crystal having a piezoelectric characteristic. The single crystal is for example a lithium niobate ($LiNbO_3$) single crystal or lithium tantalate ($LiTaO_3$) single crystal. The cut angle may be suitably set in accordance with the type etc. of the SAW to be utilized. For example, the piezoelectric substrate 3 is a rotary Y-cut and X-propagating one. That is, the X-axis is parallel to the upper surface (D1-axis) of the piezoelectric substrate 3, and the Y-axis is inclined by a predetermined angle relative to the normal line of the upper surface of the piezoelectric substrate 3. Note that, the piezoelectric substrate 3 may be one which is formed relatively thin and to which a support substrate made of an inorganic material or organic material is bonded at the back surface (the surface on the negative side of the D3-axis) as well.

The IDT electrode 5 and the reflectors 7 are configured by a layer-shaped conductor provided on the piezoelectric substrate 3. The IDT electrode 3 and the reflectors 7 are configured by the same materials in the same thicknesses as each other. The layer-shaped conductor configuring them is for example a metal. The metal is for example Al or an alloy containing Al as the principal ingredient (Al alloy). The Al alloy is for example an Al—Cu alloy. The layer-shaped conductor may be configured by a plurality of metal layers as well. The thickness of the layer-shaped conductor is suitably set in accordance with the electrical characteristics etc. demanded from the SAW resonator 1. As an example, the thickness of the layer-shaped conductor is 50 nm to 600 nm.

The IDT electrode 5 has a first comb-shaped electrode 9A and second comb-shaped electrode 9B. Each of the comb-shaped electrodes 9 has a bus bar 11 and pluralities of electrode fingers 13 which extend from the bus bar 11 parallel to each other. The pair of comb-shaped electrodes 9 are arranged so that their pluralities of electrode fingers 13 intermesh (intersect) with each other. That is, the two bus bars 11 of the pair of comb-shaped electrodes 9 are arranged so as to face each other, and the electrode fingers 13 of the first comb-shaped electrode 9A and the electrode fingers 13 of the second comb-shaped electrode 9B are basically alternately aligned in the width direction thereof. Note that, each comb-shaped electrode 9, other than those described above, may have for example so-called "dummy electrodes" which project between the electrode fingers 13 from its bus bar 11 to the bus bar 11 side of the other comb-shaped electrode 9 and face the tip ends of the electrode fingers 13 in the other comb-shaped electrode 9 as well.

The bus bars 11 are for example substantially formed in long shapes so as to linearly extend in the direction of propagation of the SAW (D1-axis direction) with constant widths. Further, the pair of bus bars 11 face each other in the direction (D2-axis direction) perpendicular to the direction of propagation of the SAW. Note that, the bus bars 11 may change in width or may be inclined relative to the direction of propagation of the SAW.

The electrode fingers 13 are for example substantially formed in long shapes so as to linearly extend in the direction (D2-axis direction) perpendicular to the direction of propagation of the SAW with constant widths. The pluralities of electrode fingers 13 are for example aligned in the direction of propagation of the SAW. Further, they have equal lengths to each other. Note that, the IDT electrode 5 may be so-called apodized as well so that the lengths of the pluralities of electrode fingers 13 (intersection widths from another viewpoint) change in accordance with the positions in the direction of propagation.

The number of electrode fingers 13 may be suitably set in accordance with the electrical characteristics etc. demanded from the SAW resonator 1. Note that, FIG. 1 etc. are schematic diagrams, therefore the number of electrode fingers 13 shown is small. In actuality, a larger number of electrode fingers 13 (for example 100 or more) than the one illustrated may be aligned. This is true also for the strip electrodes 17 in the reflectors 7 which will be explained later.

Each reflector 7 is for example formed in a lattice state. That is, the reflector 7 has a pair of bus bars 15 facing each other and a plurality of strip electrodes 17 which extend between the pair of bus bars 15.

The shapes of the bus bars 15 and the strip electrodes 17 may be made the same as those of the bus bars 11 and electrode fingers 13 in the IDT electrode 5 except for the two ends of the strip electrodes 17 being connected to the pair of bus bars 15. For example, the bus bars 15 are substantially formed in long shapes so as to linearly extend in the direction of propagation of the SAW (D1-axis direction) with constant widths. The strip electrodes 17 are substantially formed in long shapes so as to linearly extend in the direction (D2-axis direction) perpendicular to the direction of propagation of the SAW with constant widths. Further, the pluralities of strip electrodes 17 are for example aligned in the direction of propagation of the SAW. Further, they have equal lengths to each other. The pair of reflectors 7 are positioned on the two sides of the IDT electrode 5 in the direction of propagation of the SAW, and the pluralities of strip electrodes 17 are aligned continuing from the arrangement of the pluralities of electrode fingers 13.

Note that, although not particularly illustrated, the upper surface of the piezoelectric substrate 3 may be covered by a protective film made of $SiO_2$ or the like from the tops of the IDT electrode 5 and reflectors 7 as well. The protective layer may be one for simply suppressing corrosion of the IDT electrode 5 etc. or may be contribute to temperature compensation. Further, in a case where the protective film is provided etc., on the upper surfaces or lower surfaces of the IDT electrode 5 and reflectors 7, in order to improve the reflection coefficient of the SAW, an additional film made of an insulator or metal may be provided as well.

Further, in the SAW device including the SAW resonator 1, for example, although not particularly illustrated, a space permitting vibration of the upper surface of the piezoelectric substrate 3 and facilitating propagation of the SAW is formed above the piezoelectric substrate 3. This space is for example formed by forming a box type cover to be covered on the upper surface of the piezoelectric substrate 3 or by making the major surface of the circuit board and the upper surface of the piezoelectric substrate 3 face each other with a bump interposed therebetween.

(Setting of Electrode Finger Pitch)

The pitch Pt of the plurality of electrode fingers 13 (electrode finger pitch) is for example the distance between the centers of two electrode fingers 13 which are adjacent to each other. In the same way, the pitch Pt of the plurality of strip electrodes 17 or the pitch Pt between an electrode finger 13 and a strip electrode 17 is for example the distance between the centers. The pitch Pt is basically a distance. In the following explanation, however, for convenience, sometimes it will be used as substantially the same meaning as a region between the electrode fingers 13. For example, sometimes use will be made of the "number of pitches Pt" or other expressions.

In the conventional SAW resonator, the pitches Pt of the plurality of electrode fingers 13 and plurality of strip electrodes 17 are basically made constant over the entire SAW resonator. The mode of operation in such a conventional SAW resonator is as follows.

When a voltage is applied to the piezoelectric substrate 3 by the electrode fingers 13 in the IDT electrode 5, a SAW of a predetermined mode propagating in the D1-axis direction along the upper surface is excited in the vicinity of the upper surface of the piezoelectric substrate 3. The excited SAW is mechanically reflected at the electrode fingers 13. As a result, a standing wave having the pitch of the electrode fingers 13 as a half wavelength is formed. The standing wave is converted to an electrical signal having the same frequency as the standing wave and is extracted by the electrode fingers 13. The SAW resonator functions as a resonator in this way. The resonance frequency thereof is substantially the same frequency as the frequency of the SAW propagating on the piezoelectric substrate 3 having the electrode finger pitch as a half wavelength.

Note that, when referring to the "resonance frequency" in the explanation of the present embodiment, the term designates the frequency of resonance (main resonance) generated by the SAW of the intended period and mode as described above, but does not designate the frequency of so-called spurious or sub-resonance.

The SAW excited in the IDT electrode 5 is mechanically reflected at the strip electrodes 17 in the reflectors 7. Further, the strip electrodes 17 which are adjacent to each other are connected to each other by the bus bars 15, therefore the SAW from the IDT electrode 5 is reflected by the strip electrodes 17 electrically as well. Due to this, scattering of the SAW is suppressed, therefore the standing wave strongly stands in the IDT electrode 5, so the function of the SAW resonator 1 as the resonator is improved.

In the SAW resonator 1 in the present embodiment as well, in the same way as the conventional case, the resonance frequency is set according to the pitch Pt. Note, one of characterizing features of the SAW resonator 1 in the present embodiment resides in being configured so that there two or more types of pitches Pt which are different in sizes from each other (a plurality of resonance frequencies from another viewpoint). Specifically, this is as follows.

The IDT electrode 5 has a plurality of (three in the example illustrated) areas 19 (first area 19A to third area 19C) configured so that a plurality of electrode fingers 13 (pitch Pt) are distributed in each and having pitches Pt different in sizes from each other. In each of the areas 19, the sizes of the plurality of pitches Pt are constant. The pitch Pt×2 (wavelength λ) is for example 1.5 μm to 6 μm.

The number of the plurality of areas 19 and the number of types of sizes of the pitches Pt may be the same or may be different. In other words, all areas 19 may have pitches Pt having sizes different from each other, or part of the areas 19 may have pitches Pt having the same sizes as each other.

However, in the explanation of the present embodiment, basically the former will be taken as an example. The relationship between the relative sizes of pitches Pt among the plurality of areas 19 and the relative positions of the plurality of areas 19 (for example, whether the area 19 having the smallest pitch Pt is the outer side or inner side and so on) may be suitably set.

In the example in FIG. 1, the order from the area having the smallest pitch Pt to the area having the largest pitch Pt becomes the second area 19B, third area 19C, and first area 19A. Further, from another viewpoint, the second area 19B having the smallest pitch Pt is arranged between the other areas 19 (first area 19A and third area 19C).

The numbers of the electrode fingers 13 (pitches Pt) may be the same or different among the plurality of areas 19. In the latter case, the numbers of pitches Pt may be different among all areas 19 or may be the same between part of the areas. In the example in FIG. 1, the numbers of the pitches Pt are different from each other among all of the areas 19. Specifically, an area 19 having a smaller pitch Pt is increased more in the number of pitches Pt.

The widths of the electrode fingers 13 are set in accordance with the sizes of the pitches Pt and may be different among the plurality of areas 19 or may be set not according to the sizes of the pitches Pt, but common among the plurality of areas 19. In FIG. 1, the former case is exemplified. For example, the widths of the electrode fingers 13 are made common in the ratios (duty ratios) relative to the sizes of the pitches Pt among the plurality of areas 19, consequently the sizes (absolute values) are different among the areas 19. The widths of the electrode fingers 13 are for example 0.4 to 0.7 of the sizes of the pitches Pt.

Further, the IDT electrode 5 has inter-area gaps 21 (first inter-area gap 21A and second inter-area gap 21B) between two areas 19 which are adjacent to each other (between the first area 19A and the second area 19B and between the second area 19B and the third area 19C). Each inter-area gap 21, unlike the areas 19 including pluralities of pitches Pt, includes just one pitch Pt. This one pitch Pt is a pitch between the electrode finger 13 in one area 19 of the two areas 19 on the two sides which is positioned at the end part on the other area 19 side and the electrode finger 13 in the other area 19 which is positioned at the end part on the one area 19 side. Further, the size is different from any of the pitches Pt of the two areas 19 on the two sides.

The pitches Pt of the pair of reflectors 7 may be the same as each other or may be different from each other between the pair of reflectors 7. In the explanation of the present embodiment, mainly the former will be taken as an example. Further, the sizes of the pitches Pt of the reflectors 7 may be the same sizes as any of the pitches Pt of the plurality of areas 19 or may be sizes different from any of the pitches Pt of the plurality of areas 19. In the present embodiment, mainly the latter will be taken as an example.

The widths of the strip electrodes 17 may be suitably set. The duty ratios of the strip electrodes 17 may be the same as the duty ratios of the electrode fingers 13 or may be different from the latter.

The SAW resonator 1 has outer side gaps 23 (first outer side gap 23A and second outer side gap 23B) between the IDT electrode 5 and the reflectors 7 (between the first area 19A and the first reflector 7A and between the third area 19C and the second reflector 7B). Each outer side gap 23 is a region between the IDT electrode 5 and a reflector 7, therefore includes only the pitch Pt (one) between the strip electrode 17 in the reflector 7 which is positioned at the end part on the IDT electrode 5 side and the electrode finger 13 in the area 19 adjacent to the reflector 7 which is positioned at the end part on the reflector 7 side. The size of the above pitch Pt may be the same as or different from the pitches Pt of the strip electrodes 17 in the reflector 7 which is adjacent to the above pitch Pt or the electrode fingers 13 in the area 19 which is adjacent to the above pitch Pt. In the explanation of the present embodiment, mainly the latter will be taken as an example.

FIG. 2 is a graph showing an example of the relative sizes of the plurality of pitches Pt in the SAW resonator 1.

In this graph, an abscissa (n) indicates the position in the direction of propagation of the SAW (D1-axis direction), while an ordinate indicates the size of the pitch Pt. The unit of the abscissa is the number of the pitches Pt counted from the end of the SAW resonator 1. The unit of the ordinate may be grasped as an absolute value or may be grasped as a ratio relative to a size of a pitch Pt which is used as the standard. The plotted plurality of points indicate the positions and sizes of the pitches Pt. The lines connecting the plurality of points are for easy viewing of the graph.

As explained with reference to FIG. 1, among the plurality of areas 19, the sizes of the pitches Pt are different from each other. FIG. 2 also exemplifies a case where, in the same way as FIG. 1, the sizes of the pitches Pt are different from each other among all of the three areas 19 and where the second area 19B having the smallest pitch Pt is positioned at the center of the IDT electrode 5.

The sizes of the pitches Pt of the inter-area gaps 21 may be made intermediate values between the sizes of the pitches Pt of the two areas 19 on the two sides thereof, values larger than the intermediate values, or values smaller than the intermediate values.

Note that, an "intermediate value" means a value in the middle of two values. For example, when the size of the pitch Pt of one area 19 is defined as "a" and the size of the pitch Pt of another area 19 is defined as "b", the intermediate value is "(a+b)/2". That is, the intermediate value is neither a value biased to either of "a" or "b" between "a" and "b" nor a mean value obtained by dividing the sum of the sizes of the pitches Pt of the two areas 19 by the total number of the pitches Pt of the two areas. However, naturally there may be a bias due to the precision of manufacturing. This is true also for the other intermediate values which will be explained later.

In the example illustrated, the pitches Pt of the inter-area gaps 21 are smaller than the intermediate values between the two pitches Pt on the two sides thereof (indicated by dotted lines L1 and L2). Specifically, the pitch Pt of the first inter-area gap 21A is smaller than the intermediate value (dotted line L1) between the pitch Pt of the first area 19A and the pitch Pt of the second area 19B. The pitch Pt of the second inter-area gap 21B is smaller than the intermediate value (dotted line L2) between the pitch Pt of the second area 19B and the pitch Pt of the third area 19C. In the case where the pitches Pt of the inter-area gaps 21 are smaller than the intermediate values between the pitches Pt on the two sides thereof in this way, the degree of reduction may be suitably set.

The sizes of the pitches Pt of the reflectors 7 may be suitably set as already explained. However, for example, as shown in FIG. 2, when the pitch Pt of the area 19 having the smallest pitch Pt (in the example illustrated, the second area 19B) is the smallest pitch Pt_min and the pitch Pt of the area 19 having the second smallest pitch Pt (third area 19C in the example illustrated) is the pitch Pt_2nd, they are Pt_min to Pt_2nd.

The size of the pitch Pt of the outer side gap 23 may be made an intermediate value between the pitch Pt of the neighboring area 19 and the pitch Pt of the neighboring reflector 7 or a value larger than the intermediate value or a value smaller than the intermediate value described before.

In the example illustrated, the pitches Pt of the outer side gaps 23 are smaller than the intermediate values (indicated by dotted lines L3 and L4) between the two pitches Pt on the two sides thereof. Specifically, the pitch Pt of the first outer side gap 23A is smaller than the intermediate value (dotted line L3) between the pitch Pt of the first area 19A and the pitch Pt of the first reflector 7A. The pitch Pt of the second outer side gap 23B is smaller than the intermediate value (dotted line L4) between the pitch Pt of the third area 19C and the pitch Pt of the second reflector 7B. In this way, in the case where the pitch Pt of the outer side gap 23 is smaller than the intermediate value of the pitches Pt on the two sides thereof, the degree of reduction may be suitably set.

(Mode of Operation of Plurality of Areas)

Figure 3B:
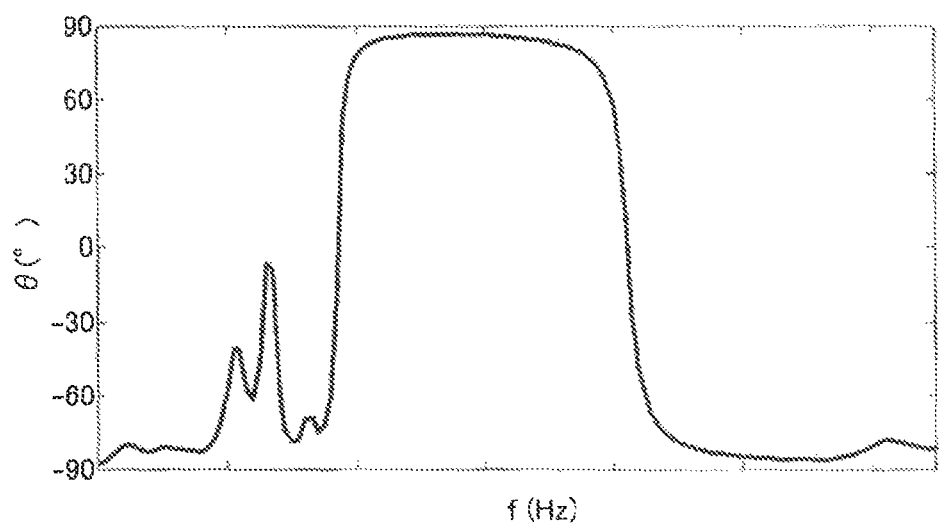

FIG. 3A and FIG. 3B are graphs showing impedances of the SAW resonator 1 for explaining the mode of operation of the SAW resonator 1.

In FIG. 3A, the abscissa (f(Hz)) indicates the frequency, while the ordinate ($|Z|(\Omega)$) indicates the absolute value of the impedance of the SAW resonator 1. In FIG. 3B, the abscissa (f(Hz)) indicates the frequency, and the ordinate ($\theta(°)$) indicates the phase of impedance of the SAW resonator 1. Note that, the reduced scales of the abscissas in FIG. 3A and FIG. 3B substantially coincide.

In FIG. 3A, a dotted line L11 indicates the characteristics of a conventional SAW resonator in which the sizes of the pitches Pt are made constant over the entire IDT electrode 5. In the conventional SAW resonator, at the frequency of the SAW having the size of the pitch Pt as a half wavelength (resonance frequency fr'), the absolute value of impedance becomes the minimum value (the resonance point appears). Further, at the antiresonance frequency fa' defined according to the resonance frequency fr' and the capacity ratio of the IDT electrode 5, the absolute value of impedance becomes the maximum value (the antiresonance point appears).

In FIG. 3A, a solid line L13 indicates the characteristics of the SAW resonator 1 in this embodiment. The IDT electrode 5 in the SAW resonator 1 is configured divided into a plurality of areas 19 connected in parallel. On the other hand, the resonance point is the resonance point as a serial resonance circuit. Accordingly, in the SAW resonator 1, a plurality of resonance points appear corresponding to the different pitches Pt of the plurality of areas 19.

For example, one resonance point appears at the frequency of the SAW having the pitch Pt of the second area 19B having the smallest pitch Pt as a half wavelength (resonance frequency fr3). Another resonance point appears at the frequency of the SAW having the pitch Pt of the third area 19C having the next smallest pitch Pt as a half wavelength (resonance frequency fr2). Still another resonance point appears at the frequency of the SAW having the pitch Pt of the first area 19A having the largest pitch Pt as a half wavelength (resonance frequency fr1).

On the other hand, the antiresonance point is the resonance point of the parallel resonance circuit. Accordingly, in the SAW resonator 1 in this embodiment as well, basically only one antiresonance point (antiresonance frequency fa) appears. Roughly speaking, the antiresonance frequency fa approaches the frequency obtained by averaging for all of the areas 19 the antiresonance frequencies when configuring the IDT electrode 5 by only each of the areas 19.

Further, it is possible to utilize the SAW resonator 1 as a resonator defined in $\Delta f$ according to the resonance frequency fr3 having the highest frequency and the antiresonance frequency fa.

Accordingly, for example, when assuming that the smallest pitch Pt_min of the SAW resonator 1 in this embodiment is equal to the pitch Pt of the conventional SAW resonator and the capacity of the IDT electrode 5 in this embodiment is the same as the capacity of the conventional IDT electrode 5, the SAW resonator 1 in this embodiment and the conventional SAW resonator coincide in resonance frequencies (fr3, fr'). On the other hand, the antiresonance frequency fa of the SAW resonator 1 in this embodiment becomes lower than the antiresonance frequency fa' of the conventional SAW resonator according to the mode of operation of the area 19 having a pitch Pt larger than the smallest pitch Pt_min. As a result, $\Delta f$ in this embodiment becomes smaller than the conventional $\Delta f'$.

From another viewpoint, in the conventional SAW resonator, when making the pitch Pt smaller (or larger), both of the resonance frequency fr' and the antiresonance frequency fa' become smaller (or larger), so the change of $\Delta f$ is relatively small. On the other hand, in this embodiment, only the antiresonance frequency fa is made larger by insertion of an area 19 having a larger pitch Pt. Alternatively, by inserting an area 19 having a smaller pitch Pt, the resonance frequency fr is made higher with a ratio larger than the ratio of rise of the antiresonance frequency fa. As a result, $\Delta f$ is suitably made smaller.

Further, since $\Delta f$ can be made smaller without using an additional capacitive element or another component in this way, for example, distortion derived from the piezoelectric substrate or change of characteristic along with the temperature change which are liable to occur due to the additional capacitive element can be eliminated.

(Differences of Plurality of Resonance Frequencies (Differences of Plurality of Kinds of Pitches))

The differences of the plurality of resonance frequencies (fr1 to fr3) may be suitably set. For example, the differences among the plurality of resonance frequencies (fr1 to fr3) may be made relatively large. In this case, for example the effect of making $\Delta f$ smaller increases. Specifically, for example, when considering the intermediate value fr_mid= (fr1+fr3)/2 (not illustrated) between the highest resonance frequency (fr3) and the lowest resonance frequency (fr1) as the reference, the ratio (|fr1−fr_mid|/fr_mid×100) relative to the intermediate value fr_mid of the difference of fr1 (or fr3) from the intermediate value fr_mid is 0.5% or more or 1% or more.

On the lower frequency side of the highest resonance frequency (fr3), a forbidden band where there is no resonance frequency may be provided. The other plurality of resonance frequencies may be made frequencies separated from the highest frequency. For example, all resonance frequencies between the lowest resonance frequency (fr1) and the highest resonance frequency (fr3) (fr2, there may be resonance frequencies other than that as well) may be on a lower frequency side than the intermediate value fr_mid between the two. That is, the resonance frequency (fr2) which is the second highest among the plurality of areas 19 may be made lower than the intermediate value fr_mid. In other words, the difference between the second highest resonance frequency and the highest resonance frequency (fr3−fr2) is above 50% of the difference between the lowest resonance frequency and the highest resonance frequency (fr3−fr1). Otherwise, the former is larger than 60% of the latter.

When a forbidden band is provided in this way, for example, in the vicinity of the highest resonance frequency (fr3) utilized for definition of Δf, a characteristic where the impedance steeply changes is obtained, while a characteristic where the impedance is lowered can be obtained in a wide range on a lower frequency side than that. When such characteristics are obtained, for example, when utilizing the SAW resonator 1 for a parallel resonator in a ladder type SAW filter (explained later), good filter characteristics are obtained.

If conditions exerted upon the resonance frequencies (for example the thicknesses and the duty ratios of the electrode fingers 13) other than the electrode finger pitches are the same among the plurality of areas 19, the changes of the sizes of the pitches Pt are substantially proportional to the changes of the resonance frequencies. Accordingly, the sizes exemplified in the above description for differences of the plurality of resonance frequencies may be referred to as an example of degrees of differences of a plurality of types of pitches Pt having different sizes as they are.

For example, the pitch Pt of the area 19 having the smallest pitch Pt (the second area 19B in the example in FIG. 2) is defined as the smallest pitch Pt_min, the pitch Pt of the area 19 having the largest pitch Pt (the first area 19A in the example in FIG. 2) is defined as the largest pitch Pt_max, and the intermediate value between the two is defined as Pt_mid. At this time, the ratio (|Pt_max−Pt_mid|/Pt_mid× 100) relative to Pt_mid of the difference of Pt_max (or Pt_min) from Pt_mid is 0.5% or more or 1% or more.

Further, for example, the pitch Pt of the area 19 having the second smallest Pt (the third area 19C in the example in FIG. 2) is defined as the pitch Pt_2nd. At this time, the difference between the second smallest pitch and the smallest pitch (Pt_2nd−Pt_min) is for example larger than 50% of the difference between the maximum pitch and the minimum pitch (Pt_max−Pt_min) or larger than 60%. Note that, the difference between the pitch Pt of the area 19 having the largest Pt and the area 19 having the smallest Pt may be made not more than the difference between the resonance frequency and the antiresonance frequency of the SAW resonator 1 as well.

(Numbers of Pitches in Each of Areas (Sizes of Each of Areas))

A sufficient number of pitches Pt of the plurality of areas 19 may be secured for each type of size (when the number of areas 19 and the number of types of pitches Pt are the same, for each area 19). In this case, for example, the effect of the highest resonance frequency (fr3) and the averaged antiresonance frequency (fa) in making Δf smaller can be more reliably obtained. For example, for all of the types of pitches Pt of the plurality of areas 19, the number of pitches Pt in each type is 20 or more or 30 or more. Further, for example, for all types of the pitches Pt of the plurality of areas 19, the number of pitches Pt in each type is 5% or more, 10% or more, or 30% or more of the number of pitches Pt in the entire IDT electrode 5.

The numbers of pitches Pt may be substantially the same as each other or different from each other among the types of sizes of the pitches Pt or among the areas 19. Further, from another viewpoint, the sizes (lengths) of the areas 19 in the direction of propagation (D1-axis direction) may be the same as each other or different from each other among the areas 19. Note that when the sizes of the areas 19 in the direction of propagation are the same as each other, the number of the pitches Pt becomes relatively larger in an area 19 having a smaller pitch Pt.

The size of an area 19 in the direction of propagation is basically a whole multiple of the pitch Pt. On the other hand, when wanting to obtain desired characteristics, it is not always possible to set a size of the plurality of areas 19 in the direction of propagation as for example common multiples of the plurality of types of pitches Pt. Accordingly, in the explanation of the present embodiment, the case where the sizes in the direction of propagation are equal to each other among the plurality of areas 19 includes a case where there is a difference less than the pitch Pt (relatively larger between two or more areas 19) as well.

The sizes of the areas 19 in the direction of propagation may be set by considering the vibration intensity (amplitude) of the SAW. For example, when assuming that the sizes of the plurality of areas 19 in the direction of propagation are equal to each other and that the voltage in Δf or a frequency on the periphery of that is applied to the SAW resonator 1, if there is an area 19 in which the vibration intensity becomes larger, that area 19 is made larger than the other areas 19 in the direction of propagation. That is, the number of pitches Pt is made larger than that in a case where the sizes of the plurality of areas 19 are made equal. In this case, for example, the following effects are exerted.

FIG. 4 is a graph for explaining an example of setting the sizes of the areas 19 in the direction of propagation (from another viewpoint, the number of electrode fingers 13 or pitches Pt).

In this graph, the abscissa (D) indicates the position in the direction of propagation of the SAW (D1-axis direction), and the ordinate (Sv) indicates the vibration intensity. Here, the "vibration intensity" indicates the vibration intensity at a frequency in the vicinity of the passing band. The unit of the abscissa, unlike FIG. 2, is the distance (for example μm). However, the difference of the pitches Pt among the plurality of areas 19 (difference of pitches Pt1 to Pt3) is for example 1% to 4%, while the number of the pitches Pt is basically larger in the area 19 having a broader range plotted on the abscissa.

This graph exemplifies a case where three types of pitches Pt (pitches Pt1 to Pt3) are provided. That is, the case where three areas 19 having pitches Pt different in sizes from each other are provided is exemplified. Note that, the outer sides of the ranges of the pitches Pt1 to Pt3 are the ranges where the reflectors 7 are arranged. Further, in this graph, illustration of the inter-area gaps 21 and outer side gaps 23 is omitted.

A line L21 indicates an example of the vibration intensity in a case where the sizes of the three areas 19 in the direction of propagation are the same (case where the ranges of the pitches Pt1 to Pt3 along the abscissa (D) are different from the example shown in FIG. 4. This case is also included in the art according to the present disclosure.) In this example, in the area 19 having the pitch Pt2, the vibration intensity (maximum value in the areas 19, below, the same in the case of comparison between areas 19) becomes relatively large. Note that, in this example, the vibration intensity in the area 19 having the pitch Pt1 becomes relatively larger a little between the area 19 having the pitch Pt1 and the area 19 having the pitch Pt3, but the vibration intensities of the two areas 19 are substantially equal.

As one of the reasons for occurrence of such a change of vibration intensity with respect to the position in the direction of propagation, there can be mentioned the fact that a plurality of areas 19 having pitches Pt different in sizes from each other are provided.

For example, due to the provision of a plurality of areas 19 having pitches Pt different in sizes from each other, SAWs having a plurality types of periods are generated. When a signal in the vicinity of the resonance frequency corresponding to these plurality of types of periods is applied, the vibration intensity becomes higher in a specific area 19.

Further, for example, when a parallel resonator of a ladder type SAW filter is configured by the SAW resonator 1, a signal in the frequency band adjacent to the low frequency side from the passing band is apt to flow in the area 19 having the highest resonance frequency. As a result, the vibration intensity becomes higher in this area 19.

Note that, in the conventional SAW resonator, such a change of vibration intensity does not occur or is small. The shape of the line indicating this vibration intensity becomes substantially a trapezoidal shape (shape resembling a line L25).

When the vibration intensity becomes larger, the voltage generated on the upper surface of the piezoelectric substrate 3 due to the vibration becomes higher, and consequently the electrical resistances of the electrode fingers 13 fall. Accordingly, for example, if the vibration intensity becomes relatively larger in any area 19 among the plurality of areas 19, a bias is generated in the electrical resistance in the IDT electrode 5. Further, the electrical resistance of the entire IDT electrode 5 ends up being determined by the area 19 in a portion having a relatively low electrical resistance. Further, the specifications which are demanded from the SAW resonator 1 are liable to be no longer satisfied.

For example, a line L23 indicates an allowable limit of the vibration intensity. Such an allowable limit is for example set so as to satisfy the electrical resistance demanded from the SAW resonator 1. In the example illustrated, the vibration intensity indicated by a line L21 in the area 19 exceeds the line L23. That is, since the electrical resistance in the area 19 is low, irrespective of the fact that the electrical resistances in the other areas 19 are within the allowable limit, the SAW resonator 1 no longer satisfies the demanded electrical resistance.

Here, as already explained, the number of pitches Pt (number of electrode fingers 13) in an area 19 in which the vibration intensity indicated by the line L21 has become larger may be made larger than the number in the case where the sizes of the plurality of areas 19 in the direction of propagation are made equal. From another viewpoint, the size in the direction of propagation of an area 19 having a large vibration intensity may be made larger than the case where the IDT electrode 5 is equally divided into a plurality of areas 19 in the direction of propagation. For example, in the example in FIG. 4, the number of pitches Pt2 is increased.

By setting in this way, for example, as indicated by the line L25, the peak of the vibration intensity can be made lower. From another viewpoint, the bias of vibration intensity with respect to the position in the direction of propagation can be lowered. As a result, the electrical resistance of the SAW resonator 1 as a whole is improved, and it becomes easier to satisfy the demanded specifications. As the reason for why increase of the number of pitches Pt in an area 19 having a large vibration intensity enables reduction of the vibration intensity, for example, there can be mentioned the fact that the voltage which raised the vibration intensity is dispersed among many electrode fingers 13.

Note that, since the area 19 having a large vibration intensity indicated by the line L21 is made larger than the case where the sizes of the plurality of areas 19 in the direction of propagation are equal, this area 19 becomes relatively large in comparison with the other areas 19.

Further, when making the area 19 having a large vibration intensity indicated by the line L21 larger in the direction of propagation, the other areas 19 may be made smaller in the direction of propagation along with this. In this case, for example, a large deviation of capacity etc. of the IDT electrode 5 from the initial designed values and so on is suppressed, therefore it becomes easier to obtain the desired characteristics. Due to this as well, the area 19 having a large vibration intensity indicated by the line L21 becomes larger than the other areas 19 in the direction of propagation.

When setting the sizes (number of pitches Pt) of the areas 19 in the direction of propagation, the relative sizes of three or more areas 19 should be made suitable ones. This same is true also in the case where the vibration intensity is considered, as described above. For example, the area 19 having the largest vibration intensity indicated by the line L21 may be made largest in the direction of propagation, while the other two or more areas 19 may be given sizes which are equal to each other. Further, for example, for all areas 19, the sizes may be made larger in the direction of propagation in the order from the largest vibration intensity indicated by the line L21.

The degree of increase when increasing the number of the pitches Pt in a specific area 19 may be suitably set. For example, the number of pitches Pt in the area 19 in which the vibration intensity indicated by the line L21 becomes largest may be made the required minimum number by which the peak of vibration intensity becomes lower than the allowable limit or may be made a number whereby a line indicating the vibration intensity forms a substantially trapezoidal shape as indicated by the line L25 (the two may be satisfied as well). Further, a distribution of numbers of pitches Pt whereby the maximum value of vibration intensity after adjusting the number of pitches Pt becomes the smallest may be found as well.

An area 19 in which the vibration intensity indicated by the line L21 becomes larger may be found by experiments or simulation. Further, the settings of the sizes (numbers of pitches Pt) of the plurality of areas 19 in the direction of propagation so that the vibration intensity becomes lower than the predetermined allowable limit may be suitably found by experiments or simulation.

However, as already explained, as the reason for appearance of the peak of the vibration intensity as indicated by the line L21, the influence of the voltage with respect to the frequency adjacent to the passing band is large. Therefore, if the number of pitches Pt is increased in the area 19 having the highest resonance frequency (smallest pitch Pt), in many cases the electrical resistance is improved.

Further, from the results explained above, in many cases, in the region having the largest vibration intensity, as a result, the size (length) in the direction of propagation becomes largest.

The change of vibration intensity with respect to the position in the direction of propagation (change of pitch Pt) differs according to the frequency of the voltage which is applied. When considering various aspects in which the SAW resonator 1 is utilized, the voltage at $\Delta f$ or a frequency on the periphery thereof may be assumed. Accordingly, by assuming a voltage at for example a frequency at the center of $\Delta f$ (intermediate value between the highest resonance frequency fr3 and the antiresonance frequency fra), it may be judged whether the product to which the resonator is applied is increased in the number of pitches Pt in an area 19 in which the vibration intensity indicated by the line L21 becomes larger as in the present embodiment (whether the size is made larger in the direction of propagation).

(Trend of Influence of Sizes of Inter-Area Gaps and Outer Side Gaps)

The inventors of the present application performed simulation computations for a plurality of cases while changing the sizes of pitches Pt of the inter-area gaps 21 and outer side gaps 23 in various ways. As a result, they found the fact that the characteristics of the SAW resonator 1 were improved if the pitches Pt of the inter-area gaps 21 and outer side gaps 23 were made smaller than the intermediate values between the two pitches Pt on the two sides of each of them. Specifically, this is as follows.

The conditions common to the plurality of cases were as follows:

Piezoelectric substrate 3: 46° Y plate X-propagated lithium tantalate (LiTaO$_3$) single crystal
  Conditions common to IDT electrode 5 and reflectors 7:
  Film thickness: 8% of 2×Pt (Pt is made mean value of all pitches of electrode fingers 13)
  Duty ratio: 0.5
  IDT electrode 5:
  Number of areas 19: 3
  Pitch Pt:
    Area 19 on one end: 1.025×2.55 μm
    Central area 19: 1.000×2.55 μm
    Area 19 on other end: 1.027×2.55 μm
  Numbers of electrode fingers 13: 41 in all areas 19 (number of pitches Pt in each area 19 is 40)
  Reflectors 7:
  Pitch Pt: 1.022×2.55 μm in all reflectors.

FIG. 5 shows the conditions which are different from each other among the plurality of cases and shows the results of simulation.

The column "Model" indicates identifying numbers attached to the plurality of cases. As shown in this column, simulations were carried out for 19 cases from Ca1 to Ca19.

The column "Contents" outlines the conditions which differ among a plurality of cases. As described as "Standard" for "Ca1" and described as "×0.9" or "×1.1" for the other cases, in cases other than Ca1, the simulations are performed under the conditions of the pitches Pt of the inter-area gaps 21 and/or outer side gaps 23 changed to 0.9 time or 1.1 times the standard case of Ca1.

Here, "Pt_R1" indicates a pitch Pt of an outer side gap 23 between an area 19 on one end described above and a reflector 7 on the outside thereof. "Pt_R2" indicates a pitch Pt of an outer side gap 23 between an area 19 on the other end and a reflector 7 on the outside thereof "Pt_I1" indicates a pitch Pt of an inter-area gap 21 between an area 19 on one end described above and the area 19 at the center. "Pt_I2" indicates a pitch Pt of an inter-area gap 21 between an area 19 on the other end described above and the area 19 at the center.

For example, the case described as "Pt_R1×0.9" indicates that Pt_R1 is changed to 0.9 time relative to Pt_R1 of the case of Ca1. A case where two or more of "R1", "R2", "I1", or "I2" are described with a slash interposed therebetween, for example "R1/R2", indicates that all of the described pitches are multiplied by 0.9 or 1.1.

Further, as indicated in "Contents", the simulation was carried out for the following cases: With respect to the case of Ca1, only the pitch Pt of one gap was multiplied by 0.9 (Ca2, Ca4, Ca8, Ca10), only the pitch Pt of one gap was multiplied by 1.1 (Ca3, Ca5, Ca9, Ca11), two gaps having the same qualities were multiplied by 0.9 (Ca6, Ca12), two gaps having the same qualities were multiplied by 1.1 (Ca7, Ca13), and 0.9 time and 1.1 time were suitably combined for four gaps (Ca14 to Ca19).

Here, the sizes of the pitches Pt of the gaps in the Case Ca1 are as follows:
  Pt_R1=1.024×2.55 μm
  Pt_I1=1.013×2.55 μm
  Pt_I2=1.014×2.55 μm
  Pt_R2=1.025×2.55 μm Note that, as will be understood from the conditions of the pitches Pt of the three areas 19 and the two reflectors 7 explained above, in all gaps, the size of the pitch Pt is an intermediate value between the pitches Pt on the two sides thereof. However, there is a minute difference due to rounding off etc.

The column "Computation results" indicates the results of judgment whether the resonance characteristics were improved with respect to the case of Ca1. "Resonance side" indicates the results of judgment of the resonance frequency side, and "Antiresonance side" indicates the results of judgment of the antiresonance frequency side. Here, "-" is displayed for the cases where no further improvement was achieved.

As shown in this column "Computation results", when the pitch Pt of an inter-area gap 21 is made smaller (Ca8, Ca10, Ca12, Ca16, and Ca19), the resonance characteristics are improved on the resonance side. Further, when the pitch Pt of an outer side gap 23 is made smaller (Ca2, Ca4, Ca6, Ca16, and Ca18), the resonance characteristics are improved on the antiresonance side.

FIG. 6A to FIG. 6F are graphs showing the characteristics of the SAW resonator 1 obtained by simulation for a portion of the cases shown in FIG. 5.

In these graphs, the abscissas indicate the frequencies (MHz), and the ordinates indicate the phases (°) of the impedances. FIG. 6A to FIG. 6C indicate the results of the case of Ca1 and the cases where the pitches Pt of the inter-area gaps 21 are made smaller (Ca12, Ca16, and Ca19). FIG. 6D to FIG. 6F indicate the results of the case of Ca1 and the cases where the pitches Pt of the outer side gaps 23 are made smaller (Ca6, Ca16, and Ca18). FIG. 6B and FIG. 6C are enlarged graphs of a portion in FIG. 6A. FIG. 6E and FIG. 6F are enlarged graphs of a portion in FIG. 6D. From these graphs, the validity of the results of judgment shown in FIG. 5 can be confirmed. Note that, in all of the cases, it is confirmed that Δf can be made smaller in comparison with the usual case where the IDT electrode 5 has the same pitches as a whole.

(Examples of Sizes of Inter-Area Gaps and Outer Side Gaps)

Next, predicated on the results of simulation described above, simulation was carried out for a plurality of cases in order to check the influence of the degree of reduction of the pitches Pt of the inter-area gaps 21 and the outer side gaps 23 in the case of such reduction.

FIG. 7 shows conditions which are different from each other among the plurality of cases and the results of simulation. The format of this table is the same as FIG. 5, so explanation of the format will be omitted. Further, the conditions common to the plurality of cases are the same as in the simulation in FIG. 5.

As shown in the column "Contents" in this table, simulation was carried out while changing the pitches Pt of the gaps within a range of 0.7 time to 0.9 time with respect to the standard case of Cb1 (same conditions as the case of Ca1). Further, simulation was carried out also for the cases of changing the sizes of the pitches Pt of both of the inter-area gaps 21 and outer side gaps 23 during which making the pitches Pt of one larger (Cb11 to Cb16).

As shown in the column "Computation results" in this table, for the outer side gaps 23, improvement of the characteristics on the antiresonance side was confirmed even if multiplying the pitches Pt by 0.7 relative to the case of Cb1 (Cb2 to Cb4 and Cb8 to Cb13). On the other hand, for the inter-area gaps 21, the effect of improvement of the characteristics on the resonance side was not obtained if making the pitch Pt too small (Cb6, Cb1, Cb9, Cb10, Cb15, and Cb16). That is, the effect of improvement of characteristics on the resonance side was obtained in the cases where the pitches Pt were 0.9 time or more (Cb5, Cb8, and Cb14).

FIG. 8A to FIG. 8F are graphs showing the resonance characteristics obtained by simulation for part of the cases shown in FIG. 7.

Figures 8A, 8B, 8C:
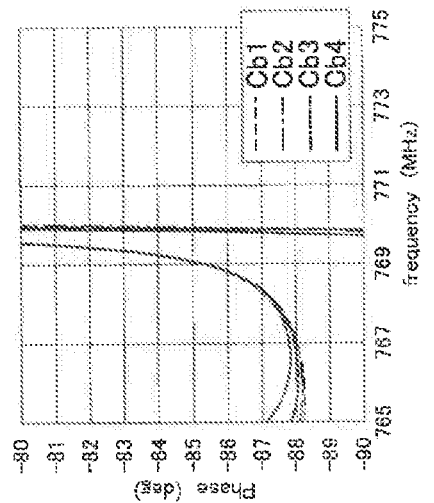
FIG. 8A to FIG. 8F are graphs showing phases of impedance for a portion of the results of simulation in FIG. 7.
Figures 8D, 8E, 8F:
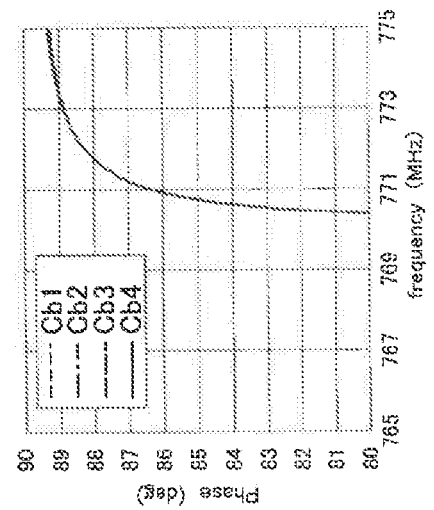

In these graphs, the abscissas indicate the frequencies (MHz), and the ordinates indicate the phases (°) of impedances. FIG. 8A to FIG. 8C indicate the results of the case of Cb1 and cases where the pitches Pt of the outer side gaps 23 were made sizes of 0.7 time to 0.9 time (Cb2 to Cb4). FIG. 8D to FIG. 8F indicate the results of cases where the pitches Pt of all gaps were made sizes of 0.7 time to 0.9 time (Cb8 to Cb10). FIG. 8B and FIG. 8C are enlarged graphs of portions in FIG. 8A. FIG. 8E and FIG. 8F are enlarged graphs of portions in FIG. 8D. From these graphs, the validity of the results of judgment shown in FIG. 7 can be confirmed.

<Ladder Type SAW Filter>
(Fundamental Configuration)

Figure 9:
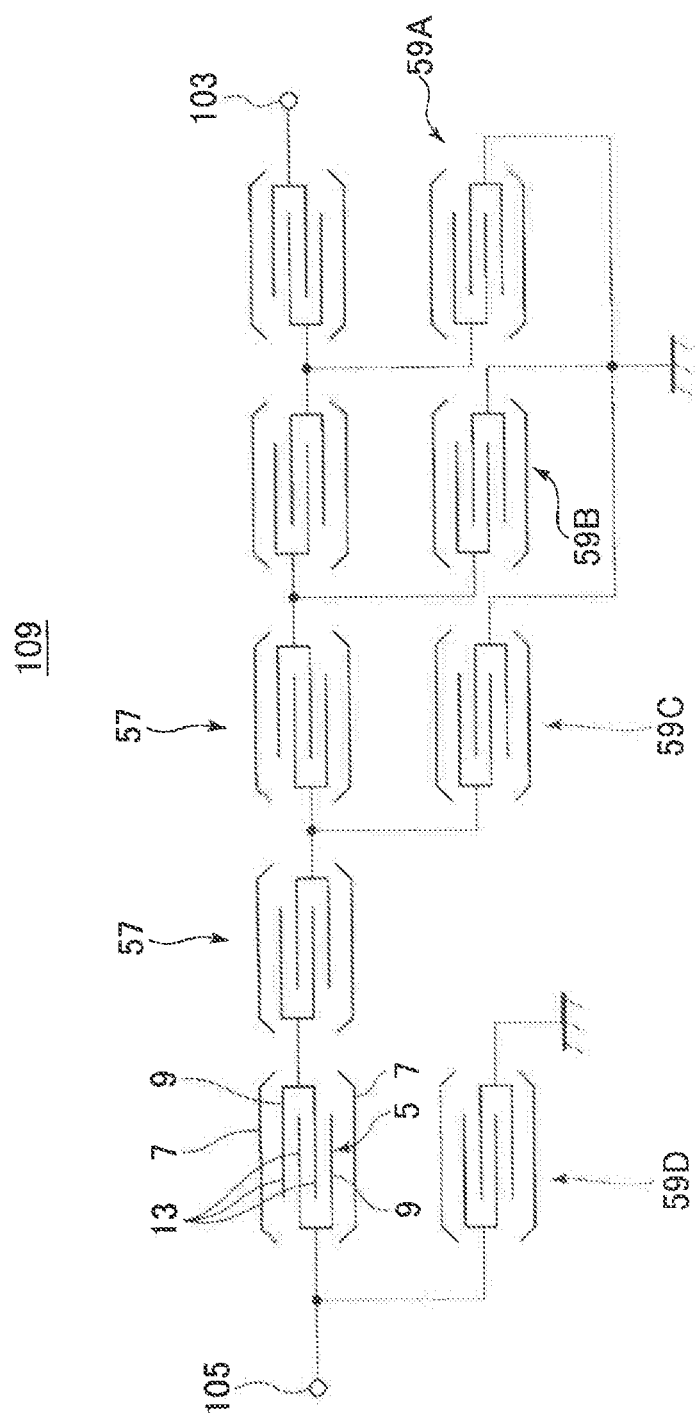
FIG. 9 A schematic view showing a ladder type SAW filter as an example of utilization of the SAW resonator in FIG. 1.

FIG. 9 is a schematic diagram showing a ladder type SAW filter 109 as an example of utilization of the SAW resonator 1.

The SAW filter 109, for example, has a plurality of serial resonators 57 which are connected in series between an input terminal 105 to which a signal is input and an output terminal 103 outputting the signal and a plurality of parallel resonators 59 which connect that serial line and a reference potential part (first parallel resonator 59A to fourth parallel resonator 59D).

Further, as will be understood from the notations of the IDT electrode 5, reflectors 7, comb-shaped electrodes 9, and electrode fingers 13 attached to the serial resonator 57 on the top left of the paper surface, at least one of the plurality of serial resonators 57 and the plurality of parallel resonators 59 is configured by the SAW resonator 1 in the present embodiment explained above, while the remaining ones are for example configured by conventional SAW resonators (SAW resonators in which the pitches Pt are basically constant over the entire IDT electrodes).

For example, in the ladder type SAW filter 109, all of the serial resonators 57 are configured by conventional SAW resonators, and at least one (or all) of the plurality of parallel resonators 59 is configured by the SAW resonator 1 in the present embodiment.

Note that, as is well known, the serial resonators 57 and parallel resonators 59 are set in their characteristics so that the antiresonance frequencies of the parallel resonators 59 substantially coincide with the resonance frequencies of the serial resonators 57. Further, a range which is bit narrower than the range obtained by adding Δf of the two resonators to each other becomes the passing band.

The plurality of sets of IDT electrodes 5 and reflectors 7 configuring the plurality of serial resonators 57 and plurality of parallel resonators 59 are for example provided on the same piezoelectric substrate 3. The numbers of the plurality of serial resonators 57 and the plurality of parallel resonators 59 may be suitably set. Further, the plurality of serial resonators 57 may be finely adjusted so that the resonance frequencies and antiresonance frequencies etc. are a bit different from each other as well. In the same way, the plurality of parallel resonators 59 may be finely adjusted so that the resonance frequencies and antiresonance frequencies etc. are a bit different from each other as well. The SAW filter 109 may have a component other than a resonator such as an inductor at a suitable position as well.

(Example of Setting Pitches in Ladder Type SAW Filter)

FIG. 10A to FIG. 10D are graphs showing examples of setting the pitches Pt in the first parallel resonator 59A to fourth parallel resonator 59D configured by the SAW resonators 1 in the present embodiment.

These graphs are the same as those in FIG. 4. In each of these graphs, a curve plotted by a one-dot chain line indicates the vibration intensity in a case where the sizes of the plurality of (three in the example illustrated) areas 19 in the direction of propagation are made equal (examples where the ranges of the pitches Pt1 to Pt3 along the abscissas (D) are different from the examples illustrated. These examples are also included in the technique according to the present disclosure.) The curve plotted by the solid line indicates the vibration intensity in the example where the number of pitches Pt (size of the area 19 in the direction of propagation) is adjusted (example where the ranges of the pitches Pt1 to Pt3 along the abscissa (D) are illustrated). The curve indicating the vibration intensity is obtained by simulation computations. As shown in these graphs, the plurality of parallel resonators 59 may be given configurations concerning the pitches Pt different from each other although the values of the pitches Pt are made relatively close. Specifically, this is as follows.

Figure 10A:
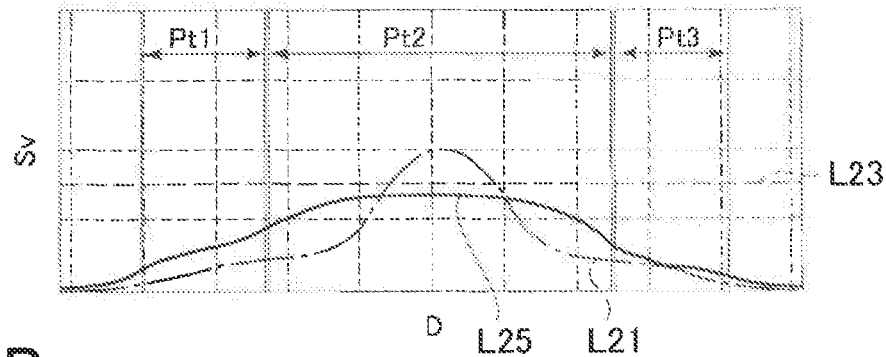
FIG. 10A to FIG. 10D are diagrams showing examples of setting of pitches in a parallel resonator of the SAW filter in FIG. 9.

FIG. 10A shows an example of setting the pitches Pt of the first parallel resonator 59A. In this example, in the same way as FIG. 4, the pitch Pt2 in the center area 19 is the smallest. Further, if the plurality of areas 19 are given sizes equal in the direction of propagation, the vibration intensity becomes larger in the center area 19. Further, by increasing the number of pitches Pt2 (making the center area 19 relatively larger in the direction of propagation), the vibration intensity can be made lower than the allowable limit indicated by the dotted line.

Figure 10B:
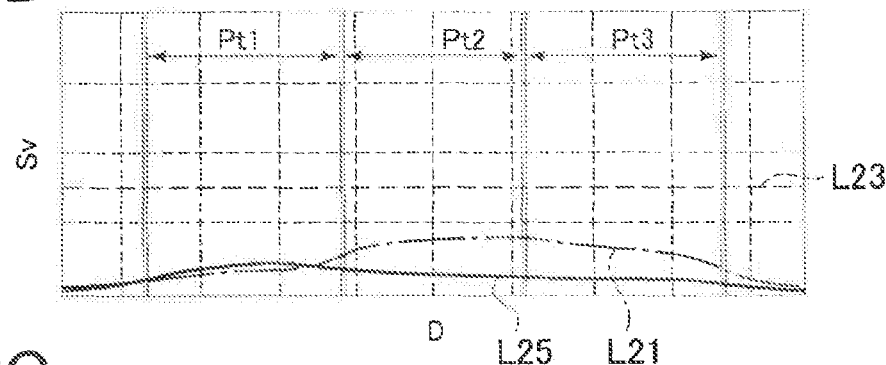

FIG. 10B shows an example of setting the pitches Pt of the second parallel resonator 59B. In this example, in the same way as FIG. 4, the pitch Pt2 in the center area 19 is the smallest. Further, Pt1>Pt3. However, in this resonator, in comparison with the first parallel resonator 59A in FIG. 10A, the differences among the pitches Pt1 to Pt3 are relatively small. Therefore, even in a case where the sizes of the three areas 19 in the direction of propagation are equal, the bias of vibration intensity is small, and the vibration intensity is lower than the allowable limit. Further, as bias, the vibration intensity becomes larger not only in the center area 19, but becomes larger in the center area 19 and in the area 19 having the pitch Pt3. Further, by making the numbers of the pitches Pt equal among the three areas 19 (sizes of the areas 19 in the direction of propagation are different among the three areas 19 in accordance with the differences of sizes of the pitches Pt1 to Pt3), the vibration intensity of a part having a high vibration intensity is further lowered.

Figure 10C:
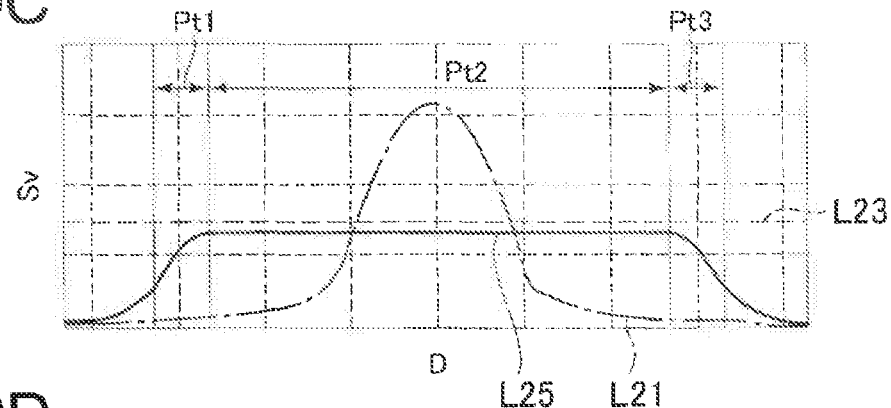

FIG. 10C shows an example of setting the pitches Pt of the third parallel resonator 59C. In this example, in the same way as FIG. 4, the pitch Pt2 in the center area 19 is the smallest. Further, if the plurality of areas 19 are given equal sizes in the direction of propagation, the vibration intensity becomes larger in the pitch Pt at the center. Further, by increasing the number of pitches Pt2 (making the center area 19 relatively larger in the direction of propagation), the vibration intensity can be made lower than the allowable limit indicated by the dotted line. Note that, in the example in FIG. 10C, as will be understood from a comparison with the other graphs, no pitch Pt having a size different from the pitches Pt of the areas 19 is provided between the areas 19, so the areas 19 are directly adjacent to each other. The same is true between the areas 19 and the reflectors 7.

Figure 10D:
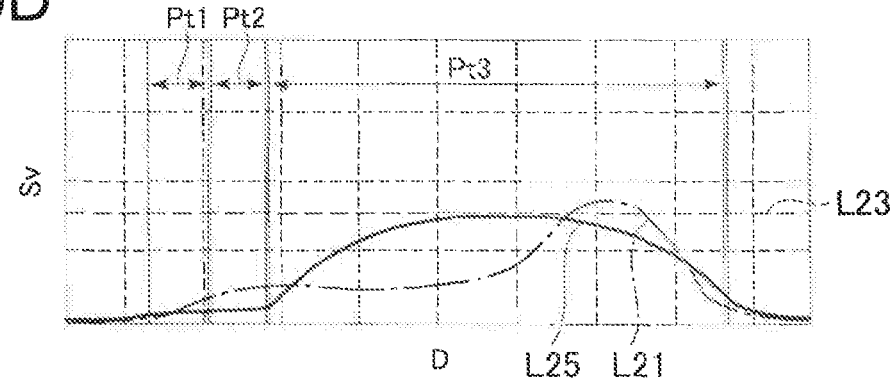

FIG. 10D shows an example of setting the pitches Pt of the fourth parallel resonator 59D. In this example, Pt3<Pt1<Pt2. Further, if making the plurality of areas 19 equal in sizes in the direction of propagation, the vibration intensity becomes larger in the area 19 having the pitch Pt3. Further, by increasing the number of pitches Pt3 (making the area 19 having the pitches Pt3 relatively larger in the direction of propagation), the vibration intensity can be made lower than the allowable limit indicated by the dotted line.

Note that, in all of FIG. 10A to FIG. 10D, the differences among the plurality of resonance frequencies show aspects explained in the description of the SAW resonator 1. That is, in each parallel resonator 59, the second highest resonance frequency becomes lower than the intermediate value between the lowest resonance frequency and the highest resonance frequency. Specifically, the ratio ((fr3−fr2)/(fr3−fr1)×100) of the difference between the highest resonance frequency (fr3 in FIG. 3A) and the second highest resonance frequency (fr2 in FIG. 3A) relative to the difference between the highest resonance frequency and the lowest resonance frequency (fr1 in FIG. 3A) is 62% (FIG. 10A), 67% (FIG. 10B), 93% (FIG. 10C), or 69% (FIG. 10D).

Further, among FIG. 10A to FIG. 10D, their highest resonance frequencies are values which are relatively close to each other, while their second highest resonance frequencies or lowest resonance frequencies are relatively scattered. By setting the resonance frequencies of the plurality of parallel resonators 59 in this way, the rise of the curve showing the pass characteristics on the low frequency side of the passing band can be made steep, and an amount of attenuation can be secured over a broad band on a lower frequency side than the passing band.

Specifically, in the examples in FIG. 10A to FIG. 10D, for the highest resonance frequency (fr3), the ratio ((fr3_max−fr3_min)/fr3_mid×100) of the difference of the highest one (made fr3_max) and the lowest one (made fr3_min) among FIG. 10A to FIG. 10D relative to the intermediate value of the two (made fr3_mid=(fr3_max+fr3_min)/2) is 0.68%. That is, the ratio is less than 1%. On the other hand, for the second highest resonance frequency (fr2), the ratio ((fr2_max−fr2_min)/fr2_mid×100) the same as that described above is 2.74%. Further, for the lowest resonance frequency (fr1), the ratio ((fr1_max−fr1_min)/fr1 mid×100) the same as that described above is 2.66%. That is, the ratios are 2% or more.

Accordingly, the ratio (2.66%) of the difference between the minimum value and the maximum value among the plurality of parallel resonators 59 relative to the intermediate value between these minimum value and maximum value for the resonance frequency of the area 19 having the lowest resonance frequency (fr1) is larger than the ratio (0.68%) of the difference between the minimum value and the maximum value among the plurality of parallel resonators 59 relative to the intermediate value between these minimum value and maximum value for the resonance frequency of the area 19 having the highest resonance frequency (fr3).

(Characteristics of Ladder Type SAW Filter)

FIG. 11A to FIG. 11E are graphs showing the results of simulation for the SAW filter 109 explained above.

Figure 11A:
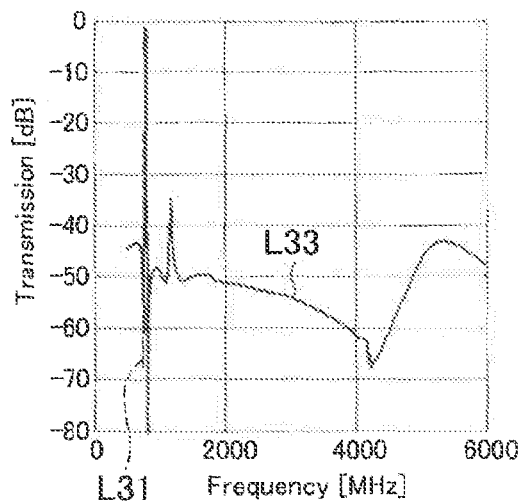
FIG. 11A to FIG. 11E are graphs showing the characteristics of the SAW filter in FIG. 9.
Figure 11B:
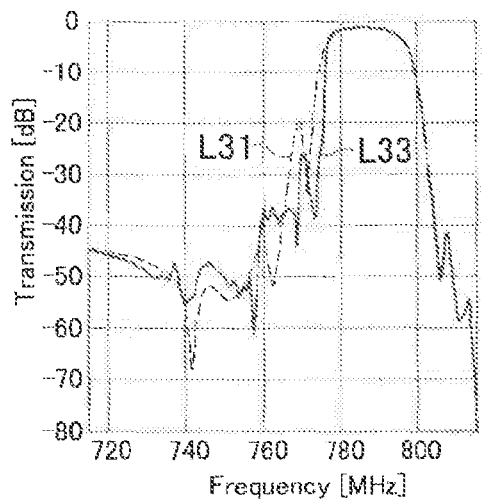
Figure 11C:
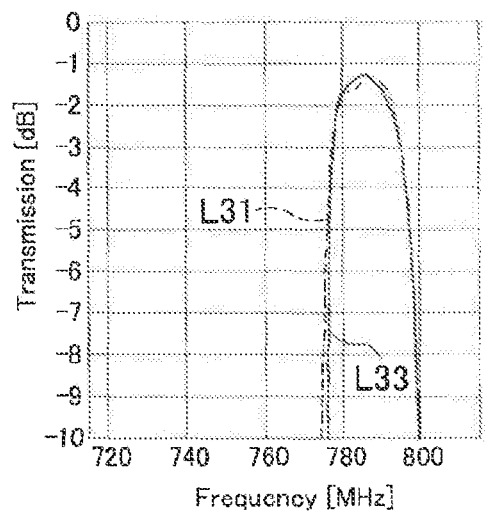
Figure 11D:
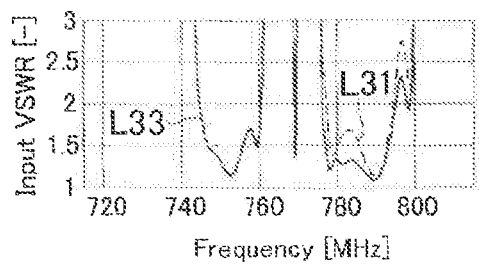
Figure 11E:
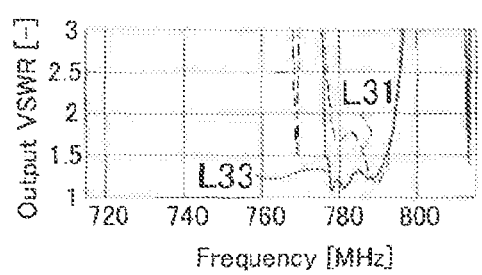

In FIG. 11A, the abscissa indicates the frequency (MHz), and the ordinate indicates the pass characteristics (dB). FIG. 11B is an enlarged graph of the passing band and its periphery in FIG. 11A. FIG. 11C is an enlarged graph of a region having a high pass characteristic in FIG. 11B. FIG. 11D indicates a ratio of a standing wave on the input terminal 105 side. FIG. 11E indicates the standing wave ratio on the output terminal 103 side.

In each graph, a line L31 indicates the characteristics of the conventional SAW filter. A line L33 indicates the characteristics of the SAW filter 109 in the present embodiment. The SAW filter 109 shown in characteristics by the line L33 is one having parallel resonators 59 which are all configured by the SAW resonators 1 in this embodiment.

It can be confirmed from these graphs that even if the ladder type SAW filter 109 is configured by using the SAW resonator 1 in the present embodiment having a plurality of areas 19 (plurality of resonance points), in the same way the conventional case, a filter characteristic where the pass characteristic becomes high in the passing band can be obtained. Further, as confirmed, due to the Δf of the parallel resonator 59 being smaller, on the low frequency side of the passing band, the rise of the curve indicating the pass characteristic becomes steeper than that in the conventional case, therefore the pass characteristics can be improved. Further, it can be confirmed too that the effect of a fall of the standing wave ratio can be obtained as well.

<Multiplexer>

Figure 12:
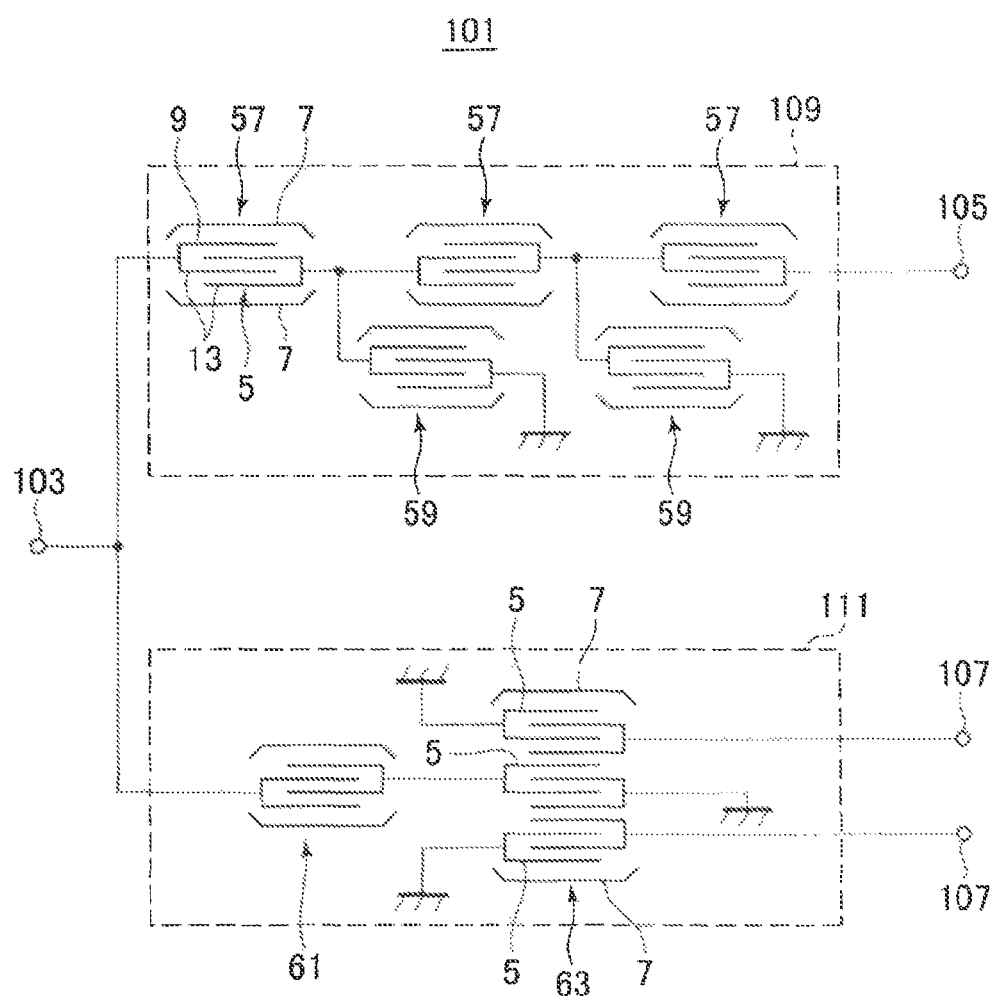
FIG. 12 A schematic view showing a multiplexer as an example of utilization of the SAW resonator in FIG. 1.

FIG. 12 is a schematic diagram showing a multiplexer 101 as an example of utilization of the SAW resonator 1. In the explanation in this diagram, sometimes different terms and the same notations will be used for the parts of the configuration which are the same as or similar to the parts of the configuration shown in FIG. 9.

The multiplexer 101 for example has a transmission filter 109 which filters a transmission signal from a transmission terminal 105 and outputs the result to an antenna terminal 103 and a receiving filter 111 for filtering the reception signal from the antenna terminal 103 and outputting the result to a pair of reception terminals 107.

The transmission filter 109 is for example the same as or similar to the ladder type SAW filter 109 explained with reference to FIG. 9.

The receiving filter 111 is for example configured by a SAW resonator 61 and a SAW filter 63 which are connected in series with each other. The IDT electrodes 5 and reflectors 7 configuring them are for example provided on the same piezoelectric substrate 3. The piezoelectric substrate 3 on which the receiving filter 111 is configured may be the same as or different from the piezoelectric substrate 3 on which the transmission filter 109 is configured.

The SAW filter 63 is for example a vertically coupled multiple mode (including double mode) type resonator filter and has a plurality of IDT electrodes 5 aligned in the direction of propagation of the SAW and a pair of reflectors 7 arranged on the two sides of the same. Note that, the SAW filter 63 may be a ladder type filter as well.

<Communication Apparatus>

Figure 13:
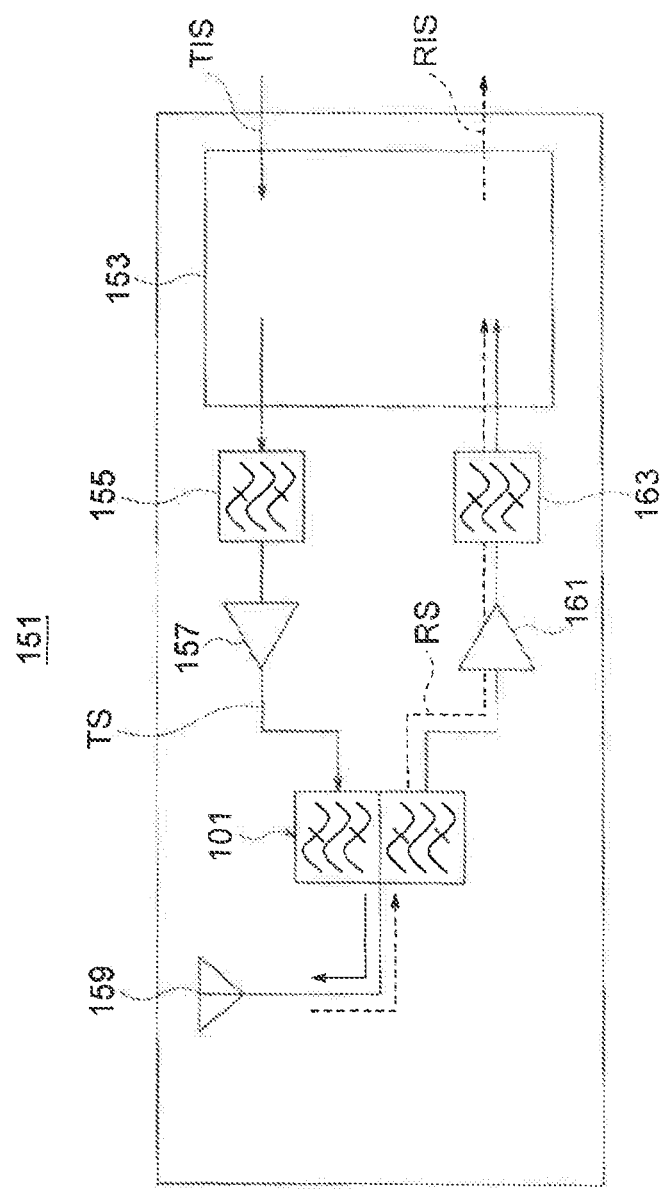
FIG. 13 A schematic view showing a communication apparatus as an example of utilization of the SAW resonator in FIG. 1.

FIG. 13 is a block diagram showing a principal part of a communication apparatus 151 as an example of utilization of the SAW resonator 1.

The communication apparatus 151 engages in wireless communications utilizing radio waves. The communication apparatus 151 utilizes the SAW resonator 1 by providing the multiplexer 101 explained above. Specifically, this is as follows.

In the communication apparatus 151, a transmission information signal TIS containing information to be transmitted is modulated and raised in frequency (conversion to a high frequency signal of a carrier frequency) by the RF-IC (radio frequency integrated circuit) 153 to become the transmission signal TS. The transmission signal TS is stripped of unwanted components other than the transmission-use passband by a bandpass filter 155, amplified by an amplifier 157, and input to the multiplexer 101 (transmission terminal 105). Further, the multiplexer 101 removes the unwanted components other than the transmission-use passband from the input transmission signal TS and outputs the transmission signal TS after the removal from the antenna terminal 103 to an antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the multiplexer 101. The multiplexer 101 removes the unwanted components other than the reception-use passband from the input reception signal RS and outputs the result to the amplifier 161. The output reception signal RS is amplified by the amplifier 161 and is stripped of unwanted components other than the reception-use passband by the bandpass filter 163. Further, the reception signal RS is lowered in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digitalized audio signals. The passband of the wireless signal may be one according to the UMTS (Universal Mobile Telecommunications System) or other various types of standards. The modulation scheme may be any of phase modulation, amplitude modulation, frequency modulation, or a combination of any two or more of them as well. As the circuit system, FIG. 13 exemplified a direct conversion system. However, it may be a suitable one other than this and may be for example the double super heterodyne system as well. Further, FIG. 13 substantially shows only the principal part in which a low pass filter or isolator etc. may be added at suitable positions. Further, the positions of the amplifiers etc. may be changed as well.

As described above, the SAW resonator 1 according to the present embodiment has a piezoelectric substrate 3, IDT electrode 5, and a pair of reflectors 7. The IDT electrode 5 has pluralities of electrode fingers 13 aligned in the direction of propagation of the SAW on the piezoelectric substrate 3. The pair of reflectors 7 are positioned on the two sides of the direction of propagation relative to the pluralities of electrode fingers 13 on the piezoelectric substrate 3. Further, the IDT electrode 5 has a plurality of areas 19 to which the pluralities of electrode fingers 13 are distributed and which are different in resonance frequencies from each other. The plurality of areas 19 include at least three areas 19. The second highest resonance frequency (fr2 in FIG. 3A) in all of the areas 19 is lower than the intermediate value between the lowest resonance frequency (fr1 in FIG. 3A) in all of the areas 19 and the highest resonance frequency (fr3 in FIG. 3A) in all of the areas 19.

Accordingly, for example, as already explained, the SAW resonator 1 can be utilized as a resonator having the difference between the highest resonance frequency and the averaged antiresonance frequency as Δf, therefore Δf can be made smaller. Accordingly, without providing the capacity element connected parallel to the IDT electrode 5 or by making the capacity of the capacity element smaller, Δf can be made smaller. As a result, for example, it is easy to reduce the size of the SAW resonator 1. Further, it is also possible to improve the temperature characteristic in comparison with the case where the capacity element is provided.

Further, for example, unlike the present embodiment, when trying to make Δf smaller by gradually changing the electrode finger pitches over the entire IDT electrode 5 without providing the plurality of areas 19 having resonance frequencies which are different from each other, it becomes harder to form an SAW having a constant wavelength over the plurality of electrode finger pitches, therefore the resonance characteristic is degraded. In the present embodiment, however, each area 19 may have the same configuration as the usual IDT electrode 5, therefore a good resonance characteristic can be realized. Consequently a good resonance characteristic can be realized in the SAW resonator 1 as a whole as well.

Further, as already explained as well, by making the differences between the highest resonance frequency and the second highest and following resonance frequencies relatively larger, it is possible to make the resonance point with the highest frequency defining Δf clearly appear while generating a plurality of resonance points over a broad band on a lower frequency side than this resonance point. As a result, for example, when utilizing the SAW resonator 1 as a parallel resonator 59 of a ladder type SAW filter 109, on the low frequency side of the passing band, the rise of the curve indicating the pass characteristics is made steep, while an attenuation amount can be secured in a broad band on a lower frequency side than the passing band.

Further, in the present embodiment, in each of the plurality of areas 19, the electrode finger pitches (pitches Pt of the electrode fingers 13) are constant. The area 19 having the lowest resonance frequency (first area 19A in FIG. 1) has an electrode finger pitch which is the largest among all of the areas 19 (Pt_max in FIG. 2). The area 19 having the highest resonance frequency (second area 19B in FIG. 1) has an electrode finger pitch which is the smallest among all of the areas 19 (Pt_min in FIG. 2). The area 19 having the second highest resonance frequency (third area 19C in FIG. 1) has the electrode finger pitch which is the second smallest among all of the areas 19 (Pt_2nd in FIG. 2). The second smallest electrode finger pitch is larger than the intermediate value between the largest electrode finger pitch and the smallest electrode finger pitch (Pt_mid in FIG. 2).

Accordingly, by suitably setting the electrode finger pitches of the plurality of areas 19, a plurality of resonance frequencies which are different from each other as explained above can be realized. The resonance frequency can also be adjusted according to the thickness of the IDT electrode 5 and/or duty ratio of the electrode finger 13 or other conditions. However, in light of the theory of SAW resonators, the basic practice is adjustment by the electrode finger pitch. Realization of the desired plurality of resonance frequencies is easy.

Further, in the present embodiment, each of the pair of reflectors has a plurality of strip electrodes 17 aligned in the direction of propagation. The pitch of the plurality of strip electrodes 17 is larger than the smallest electrode finger pitch among the plurality of areas 19 (Pt_min in FIG. 2) and is smaller than the second smallest electrode finger pitch among the areas 19 (Pt_2nd in FIG. 2).

Accordingly, for example, the reflectors suitably reflect the SAW relating to the highest resonance frequency which defines Δf while reflect SAWs having various wavelengths, so good resonance characteristics can be realized as a whole.

Further, in the present embodiment, other areas (first area 19A and third area 19C in FIG. 1) are positioned on the two sides of the area 19 having the smallest electrode finger pitch (second area 19B in FIG. 1) among the plurality of areas 19.

Accordingly, for example, the area 19 having the resonance frequency defining Δf is arranged at the position which is the best for raising a standing wave (center side of the IDT electrode 5 in the direction of propagation). As a result, for example, the resonance frequency defining Δf is clearly generated, therefore good characteristics can be realized in the SAW resonator 1 as a whole.

Note that, in the above embodiment, the SAW resonator 1 is one example of an acoustic wave resonator, and the SAW filter 109 is one example of an acoustic wave filter.

(Modification)

Figure 14:
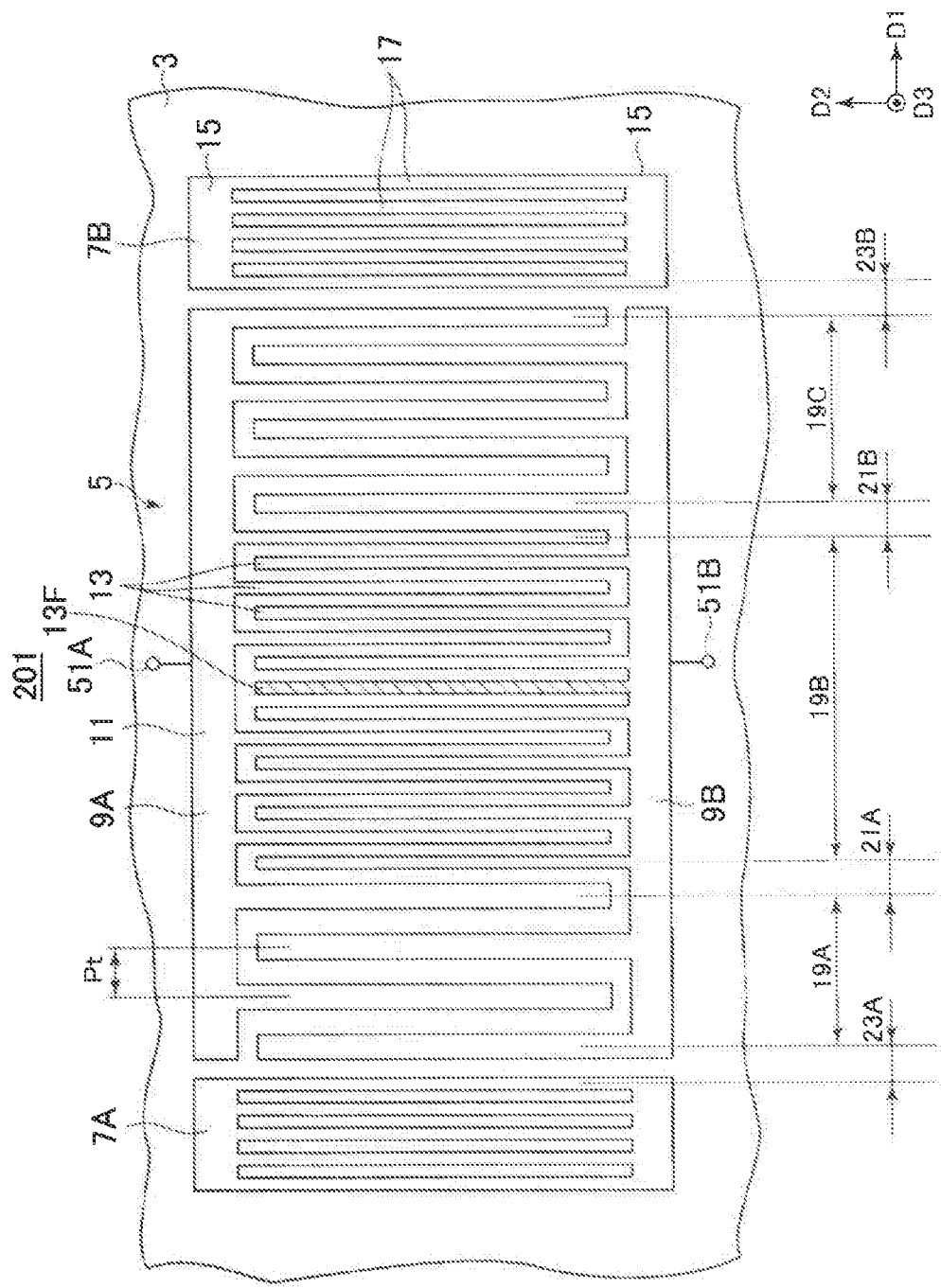
FIG. 14 A plan view showing a SAW resonator according to a modification.

FIG. 14 is a plan view showing the configuration of a SAW resonator 201 according to a modification.

The SAW resonator 201 differs from the SAW resonator 1 only in the point that so-called thinning of electrode fingers is carried out and is the same as the SAW resonator 1 in other points. Note that, in the following description, use will be made of notations relating to the SAW resonator 1 for the SAW resonator 201 as well. Further, basically only parts different from the SAW resonator 1 will be explained.

In the example in FIG. 14, thinning is carried out at the position of an electrode finger 13F indicated by hatching. In the IDT electrode 5, basically the electrode fingers 13 in the first comb-shaped electrode 9A and the electrode fingers 13 in the second comb-shaped electrode 9B are alternately aligned. "Thinning" means that an electrode finger 13 which should be arranged in light of the regularity of this alternate arrangement is not arranged. In the example in FIG. 14, an electrode finger 13 of the first comb-shaped electrode 9A is not arranged at the position (position of the electrode finger 13F) where the electrode finger 13 of the first comb-shaped electrode 9A should be arranged (an electrode finger 13 of the second comb-shaped electrode 9B is arranged contrary to regularity). The thinning is carried out by that.

At the position where thinning is carried out, as in the example shown, an electrode finger 13 of the comb-shaped electrode 9 (second comb-shaped electrode 9B in the example illustrated) which intermeshes with the comb-shaped electrode 9 having the electrode finger 13 which should be arranged (first comb-shaped electrode 9A in the example illustrated) may be arranged. Further, unlike the example illustrated, the position where thinning is carried out may be changed to a position where no electrode finger 13 of any comb-shaped electrode 9 is arranged. Further, an electrode finger 13 having a broad width may be arranged at the position where thinning was carried out as well. For example, in the second comb-shaped electrode 9B in FIG. 14, an electrode finger 13 having a width wide enough to cover the range of three electrode fingers in total including the position of the electrode finger 13F and the positions of the electrode fingers 13 on the two sides thereof may be provided as well.

Note that, the concept of thinning is predicated on a certain extent of regularity existing in the arrangement of the electrode fingers 13 in the major part of an area 19 (other than the thinned out part). Accordingly, the judgment of whether the various types of aspects exemplified in the explanation of the SAW resonator 1 work can be carried out while excluding the thinned out part (or assuming that thinning is not carried out). Further, the judgment may be carried out in this way. This is because the outline of the characteristics of the SAW resonator are defined by the major part having regularity. For example, in each area 19, the judgment whether the electrode finger pitch Pt is constant may be carried out excluding the thinned out part. Further, for example, the comparison may be carried out while excluding the thinned out part in a case where sizes of the electrode finger pitches are compared among a plurality of areas (for example a case of judgment of whether the area having the lowest resonance frequency has an electrode finger pitch which is largest among all of the areas).

Thinning may be carried out in any area 19 among the plurality of areas 19 as well. For example, the area 19 for which thinning is carried out is the area 19 having the highest resonance frequency or the area 19 having the smallest electrode finger pitch among the plurality of areas 19 (here, the second area 19B in both). Further, the area 19 for which thinning is carried out is the area 19 where the vibration intensity becomes the largest among the plurality of areas 19 when assuming that the sizes of the plurality of areas 19 in the D1-axis direction (direction of propagation of the SAW) are equal to each other, and a voltage having a frequency which is at the middle between the highest resonance frequency fr3 and the antiresonance frequency fa of the IDT electrode 5 ((fr3+fa)/2) is applied to the IDT electrode 5.

In the example in FIG. 14, thinning is carried out only at the position of the electrode finger 13F. That is, thinning is carried out for only one finger. However, an electrode finger 13 of the first comb-shaped electrode 9A which is two electrode fingers away from the electrode finger 13F may also be thinned out. In this way, thinning may be carried out for two or more fingers as well. Further, rather than thinning a plurality of every other electrode fingers 13, it is also possible to thin out one or more electrode fingers in each of the plurality of portions which are separated by portions in which the electrode fingers 13 of the first comb-shaped electrode 9A and the electrode fingers 13 of the second comb-shaped electrode 9B are alternately aligned.

Thinning may be carried out at any position in an area 19 in the direction of propagation of the SAW (D1-axis direction) as well. For example, thinning may be carried out at the center of the area 19. The term "center" referred to here is for example based on the distance of the area 19 in the D1-axis direction. However, the electrode finger pitch in an area 19 is basically constant, therefore it may be the center based on the number of electrode fingers 13 as well. In a case where two electrode fingers 13 are positioned sandwiching the center of the area 19 therebetween (for example a case where the number of the electrode fingers 13 of the area 19 is an even number), it may be regarded that thinning has been carried out at the center even if one of these two electrode fingers 13 is thinned out.

Figure 15A:
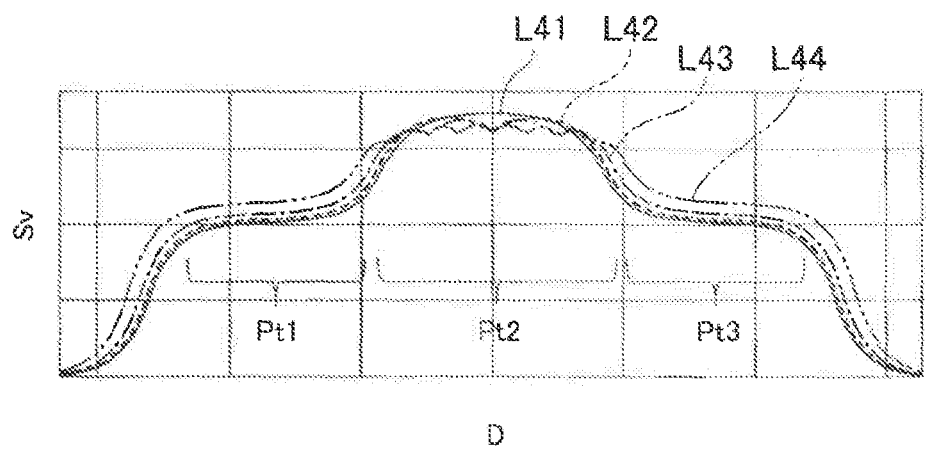
FIG. 15A to FIG. 15C are graphs showing vibration intensities and impedances of the SAW resonator in FIG. 14.
Figure 15B:
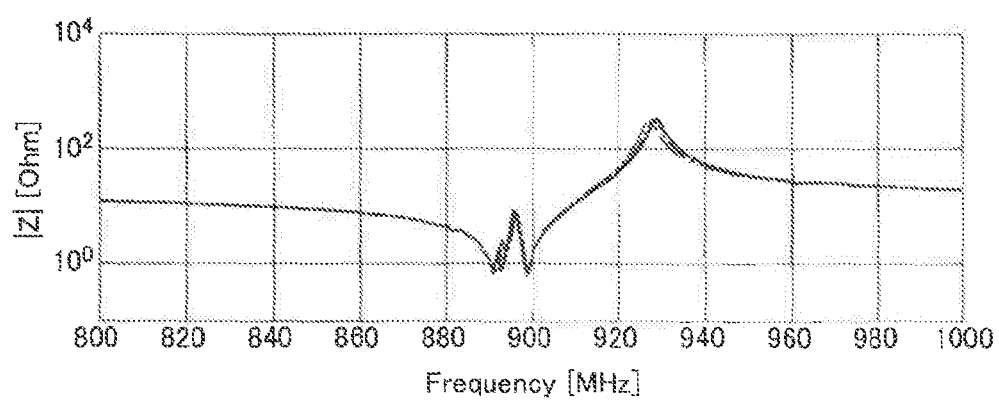
Figure 15C:
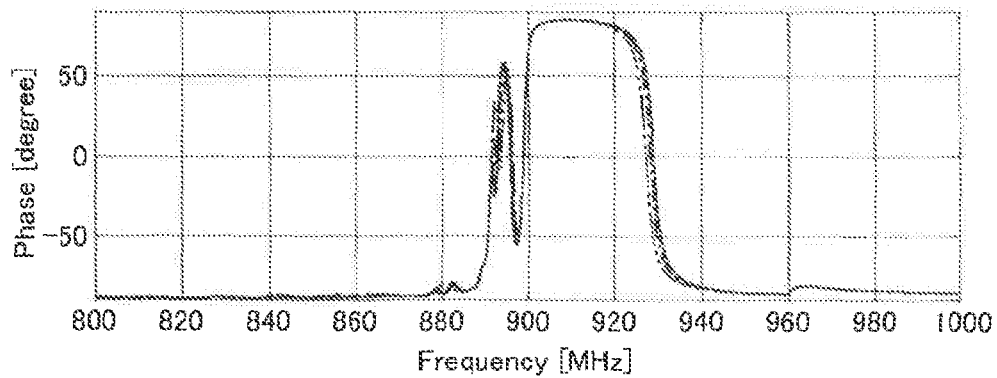

FIG. 15A to FIG. 15C are graphs for explaining the influence of thinning. These graphs are based on simulation computations. Under the computation conditions, Pt2<Pt1≈Pt3 stands.

FIG. 15A is a graph the same as FIG. 4 and shows the relationships between the position D in the D1-axis direction (abscissa) and the vibration intensity Sv (ordinate).

A line L41 correspond to the example of no thinning, while the lines L42 to L44 correspond to the example where there is thinning. That is, the line L41 corresponds to the SAW resonator 1 in this embodiment, and the lines L42 to L44 correspond to the SAW resonator 201 in the modification. Further, the line L42 corresponds to the example where thinning is carried out at one position, the line L43 corresponds to the example where thinning is carried out at three positions, and the line L44 corresponds to the example where thinning is carried out at seven positions. "Three positions" or "seven positions" referred to here (plurality of positions) designate the number of the positions which are separated by portions where the electrode fingers 13 of the first comb-shaped electrode 9A and the electrode fingers 13 of the second comb-shaped electrode 9B are alternately aligned. Further, one electrode finger is thinned out at one position. In each of the line L42 to the line L44, thinning is carried out only in the area 19 having the smallest electrode finger pitch Pt (area 19 having the pitch Pt2).

As explained in the explanation of the SAW resonator 1, in an area 19 having a small electrode finger pitch Pt, the vibration intensity is apt to become higher in comparison with the other areas 19. Accordingly, in FIG. 15A, in any of the lines L42 to L44, the vibration intensity becomes higher in the area 19 having the electrode finger pitch Pt2.

When comparing the line L41 without thinning and the lines L42 to L44 with thinning, in the lines L42 to L44, in comparison with the line L41, the vibration intensity falls at the position where thinning is carried out. Consequently, in the lines L42 to L44, in comparison with the line L41, the peak value of the vibration intensity falls in the area 19 where the thinning is carried out. The area 19 in which thinning is carried out is the area 19 having the highest vibration intensity among the plurality of areas 19, therefore the peak value of the vibration intensity falls also in the IDT electrode 5 as a whole. As a result, for example, the electrical resistance of the IDT electrode 5 is improved.

In the line L41, the peak value of the vibration intensity appears at the center of the area 19 having the electrode finger pitch Pt2. On the other hand, in all of the lines L42 to L44, thinning is carried out at the center of the area 19 having the electrode finger pitch Pt2. Accordingly, a drop of the vibration intensity due to thinning occurs at the position where the peak value of the vibration intensity appears in a case where thinning is not carried out. As a result, the peak value of the vibration intensity effectively falls.

When comparing the vibration intensities among the lines L42 to L44 with thinning, the larger the number of fingers thinned, the larger the positions where the vibration intensity falls and consequently the lower the peak value of the vibration intensity.

Due to thinning being carried out, in the area 19 where thinning is not carried out, conversely to the area 19 where thinning is carried out, the vibration intensity rises. Further, the larger the number of fingers thinned, the larger the amount of the rise. It is seen from this fact that the energy in the area 19 where thinning was carried out is dispersed to the areas 19 where thinning is not carried out.

Note that, in the example illustrated, the vibration intensity of an area 19 where thinning is not carried out is lower than the vibration intensity of an area 19 where thinning is carried out even if it rises due to thinning. Accordingly, for example, the rise of the vibration intensity in an area 19 where thinning is not carried out exerts almost no influence upon the electrical resistance of the IDT electrode 5 as a whole.

FIG. 15B is a graph the same as FIG. 3A and shows the relationships between the frequency (abscissa) and the absolute value of impedance (ordinate). FIG. 15C is a graph the same as FIG. 3B and shows the relationships between the frequency (abscissa) and the phase of impedance (ordinate). The relationships between the types of lines and thinning in these graphs are the same as FIG. 15A.

As shown in FIG. 15B, by performing thinning, $\Delta f$ becomes smaller. Further, the larger the number of fingers thinned, the smaller the $\Delta f$. Accordingly, for example, by applying the SAW resonator 201 according to this modification to a parallel resonator 59, the steepness on the low frequency side of the passing band can be improved.

Note that, in FIG. 15B, it will be understood that if thinning is carried out or the number of fingers thinned increases, the difference between the impedance in the resonance frequency and the impedance in the antiresonance frequency will be reduced even if the degree is very small. Further, in FIG. 15C, it will be understood that if thinning is carried out or the number of fingers thinned increases, the phase of impedance will deviate from 90° on a high frequency side in the passing band. Accordingly, presence of thinning and its number may be suitably set by considering the electrical resistance (vibration intensity), $\Delta f$, and other circumstances.

The art according to the present disclosure is not limited to the above embodiment or modification and may be executed in various ways.

The acoustic wave is not limited to an SAW. For example, the acoustic wave may be a bulk wave propagating in the piezoelectric substrate or an elastic boundary wave propagating in a boundary portion between the piezoelectric substrate and an insulation layer covering the piezoelectric substrate (however, one type of the SAW in a broad sense) as well.

The differences of resonance frequencies among areas are not limited to ones realized by the electrode finger pitches being different among the areas. For example, the differences of resonance frequencies among areas may be realized by the electrode film thicknesses or duty ratios being different among areas as well. Specifically, when the electrode film thicknesses are made larger (from another viewpoint, when the mass of the electrode is made larger), the resonance frequency and antiresonance frequency can be made lower. Further, when the widths of the electrode fingers (duty ratios) are made larger, the resonance frequency and antiresonance frequency can be made lower. Further, for example, any combination of two or more of the electrode finger pitches, electrode film thicknesses, and duty ratios may be different among areas. The differences of resonance frequencies among areas may be realized by this as well.

In each area, the conditions exerting influence upon the resonance frequency (electrode finger pitches, electrode film thicknesses, and duty ratios etc.) may be basically constant over that entire area. Note, a special part may be provided in a part for fine adjustment of the resonance characteristics etc. For example, as explained in the modification, so-called thinning may be carried out as well. Further, in a relatively small number of electrode finger pitches, sizes thereof may change as well.

Note that, as referred to also in the explanation of the modification, it may be judged whether the electrode finger pitch etc. are constant in each area while excluding the special part described above. This is because the concept of the special part is predicated on the regularity in the majority of the parts other than this, and the outline of the characteristics of the acoustic wave resonator are defined according to the majority of the parts. For example, if the electrode finger pitches are constant for the majority of parts in the areas and the electrode finger pitches are different among the plurality of areas, the effect of reducing $\Delta f$ can be obtained. In the same way, when comparing the electrode finger pitches among a plurality of areas, the comparison may be carried out while excluding the special part.

Further, the IDT electrode may have portions having electrode finger pitches (electrode fingers) other than the above areas, inter-area gaps, and outer side gaps. For example, narrow pitch parts where the electrode finger pitches become narrower toward the outer side may be provided outside of the plurality of areas as well.

As exemplified in FIG. 10C, an inter-area gap need not be provided either. That is, in two areas neighboring to each other, the electrode finger in one area which is positioned at the end part on the other area side and the electrode finger in the other area which is positioned at the end part on one area side may be shared. The width of the shared electrode finger in this case may be equal to the width of the electrode finger in any one of the two areas or may be an average size relative to the widths of the electrode fingers in the two areas.

The number of resonance frequencies (for example the number of types of sizes of the electrode finger pitches) and the number of areas may be made the same. In this case, for example, the regions where a standing wave having a constant wavelength is apt to be generated will be gathered into one, so the resonance characteristics are improved. However, two or more areas having the same resonance frequency may exist as well.

Further, the parallel resonator 59 configuring the SAW filter 109 may be serially divided as well. In this case, by designing the IDT electrode 5 as explained above in each of the divided sections, it is possible to provide an acoustic wave resonator which is further excellent in electrical resistance.

REFERENCE SIGNS LIST

1 . . . SAW resonator (acoustic wave resonator), 3 . . . piezoelectric substrate, 5 . . . IDT electrode, 7 . . . reflector, 13 . . . electrode finger, and 19 . . . area.

The invention claimed is:
1. An acoustic wave resonator, comprising:
a piezoelectric substrate,
an IDT electrode comprising pluralities of electrode fingers aligned in a direction of propagation of an acoustic wave on the piezoelectric substrate, and
a pair of reflectors on two sides of the pluralities of electrode fingers on the piezoelectric substrate in the direction of propagation, wherein
the IDT electrode further comprising a plurality of areas, a plurality of electrode fingers among the pluralities of electrode fingers being distributed to each of the areas, the areas having resonance frequencies different from each other,
the plurality of areas comprise at least an area having a lowest resonance frequency among all areas, an area having a highest resonance frequency among all of the areas, and an area having a resonance frequency which is higher than the lowest resonance frequency and is second highest among all of the areas, and
the second highest resonance frequency is lower than an intermediate value between the lowest resonance frequency and the highest resonance frequency.
2. The acoustic wave resonator according to claim 1, wherein:
in each of the plurality of areas, the electrode finger pitch is constant,
the area having the lowest resonance frequency has the largest electrode finger pitch among all of the areas,
the area having the highest resonance frequency has the smallest electrode finger pitch among all of the areas,
the area having the second highest resonance frequency has an electrode finger pitch which is second smallest among all of the areas, and
the second smallest electrode finger pitch is larger than an intermediate value between the largest electrode finger pitch and the smallest electrode finger pitch.
3. The acoustic wave resonator according to claim 2, wherein between any two areas adjacent to each other among the plurality of areas, an electrode finger in one area at an end part on the other area side and an electrode finger in the other area at an end part on the one area side are two electrode fingers which are adjacent to each other, and the electrode finger pitch of these two electrode fingers is different in size from any of the electrode finger pitches in the two areas and is smaller than an intermediate value between the electrode finger pitches in the two areas.
4. The acoustic wave resonator according to claim 2, wherein:
one reflector of the pair of reflectors comprises a plurality of strip electrodes aligned in the direction of propagation, and
the pitch between a strip electrode in the one reflector which is located at an end part on the IDT electrode side and an electrode finger in an area adjacent to the one reflector among the plurality of areas which is located at an end part on the one reflector side is different in size from both of the pitch of the plurality of strip electrodes and the electrode finger pitch in the adjacent area and is smaller than an intermediate value between the pitch of the plurality of strip electrodes and the electrode finger pitch in the adjacent area.
5. The acoustic wave resonator according to claim 2, wherein:
each of the pair of reflectors comprises a plurality of strip electrodes aligned in the direction of propagation, and
the pitch of the plurality of strip electrodes is larger than the electrode finger pitch in the area having the smallest electrode finger pitch and is smaller than the electrode finger pitch in the area having the second smallest electrode finger pitch.
6. The acoustic wave resonator according to claim 2, wherein in the plurality of areas, other areas are located on the two sides of the area having the smallest electrode finger pitch.
7. The acoustic wave resonator according to claim 1, wherein, when assuming that sizes in the direction of propagation of the plurality of areas are equal to each other and applying a voltage having an intermediate frequency between the highest resonance frequency and an antiresonance frequency of the IDT electrode to the IDT electrode, an area in which the vibration intensity becomes the largest among the plurality of areas is the largest in size in the direction of propagation among the plurality of areas.
8. The acoustic wave resonator according to claim 1, wherein the area having the highest resonance frequency is largest in size in the direction of propagation among the plurality of areas.
9. The acoustic wave resonator according to claim 1, wherein the area having the highest resonance frequency comprises a portion in which thinning of the plurality of electrode fingers is carried out.
10. The acoustic wave resonator according to claim 9, wherein the portion in which thinning is carried out is located at a center of the area having the highest resonance frequency.

11. An acoustic wave resonator, comprising:
a piezoelectric substrate,
an IDT electrode comprising pluralities of electrode fingers aligned in a direction of propagation of an acoustic wave on the piezoelectric substrate, and
a pair of reflectors located on the two sides of the pluralities of electrode fingers on the piezoelectric substrate in the direction of propagation, wherein
the IDT electrode comprises a plurality of areas, a plurality of electrode fingers among the pluralities of electrode fingers being distributed to each of the areas, each of the areas having constant electrode finger pitch, the areas having resonance frequencies different from each other, and,
between any two areas adjacent to each other among the plurality of areas, an electrode finger in one area at an end part on the other area side and an electrode finger in the other area at an end part on the one area side are two electrode fingers which are adjacent to each other, and the electrode finger pitch of these two electrode fingers is different in size from any of the electrode finger pitches in the two areas and is smaller than an intermediate value between the electrode finger pitches in the two areas, wherein the acoustic wave resonator is a 1-port resonator.

12. The acoustic wave resonator according to claim 11, wherein the area having the highest resonance frequency is largest in size in the direction of propagation among the plurality of areas.

13. An acoustic wave filter, comprising:
one or more serial resonators and one or more parallel resonators which are connected in a ladder form, wherein
at least one of the one or more parallel resonators is configured by an acoustic wave resonator, wherein the acoustic wave resonator, comprising:
a piezoelectric substrate,
an IDT electrode comprising pluralities of electrode fingers aligned in a direction of propagation of an acoustic wave on the piezoelectric substrate, and
a pair of reflectors on two sides of the pluralities of electrode fingers on the piezoelectric substrate in the direction of propagation, wherein
the IDT electrode further comprising a plurality of areas, a plurality of electrode fingers among the pluralities of electrode fingers being distributed to each of the areas, the areas having resonance frequencies different from each other,
the plurality of areas comprise at least an area having a lowest resonance frequency among all areas, an area having a highest resonance frequency among all of the areas, and an area having a resonance frequency which is higher than the lowest resonance frequency and is second highest among all of the areas, and
the second highest resonance frequency is lower than an intermediate value between the lowest resonance frequency and the highest resonance frequency.

14. The acoustic wave filter according to claim 12, comprising a plurality of the parallel resonators each of which is configured by the acoustic wave resonator, wherein for the resonance frequency of the area having the lowest resonance frequency, a ratio of a difference between the minimum value and the maximum value among the plurality of parallel resonators relative to an intermediate value between these minimum value and maximum value is larger than a ratio of a difference between the minimum value and the maximum value among the plurality of parallel resonators relative to an intermediate value between these minimum value and maximum value for the resonance frequency of the area having the highest resonance frequency.

15. A multiplexer, comprising:
an antenna terminal,
a transmission filter filtering a transmission signal and outputting the result to the antenna terminal, and
a receiving filter filtering a reception signal from the antenna terminal, wherein
at least one of the transmission filter and an acoustic wave filter comprising:
one or more serial resonators and one or more parallel resonators which are connected in a ladder form, wherein
at least one of the one or more parallel resonators is configured by an acoustic wave resonator, wherein the acoustic wave resonator, comprising:
a piezoelectric substrate,
an IDT electrode comprising pluralities of electrode fingers aligned in a direction of propagation of an acoustic wave on the piezoelectric substrate,
and a pair of reflectors on two sides of the pluralities of electrode fingers on the piezoelectric substrate in the direction of propagation, wherein
the IDT electrode further comprising a plurality of areas, a plurality of electrode fingers among the pluralities of electrode fingers being distributed to each of the areas, the areas having resonance frequencies different from each other,
the plurality of areas comprise at least an area having a lowest resonance frequency among all areas, an area having a highest resonance frequency among all of the areas, and an area having a resonance frequency which is higher than the lowest resonance frequency and is second highest among all of the areas,
the second highest resonance frequency is lower than an intermediate value between the lowest resonance frequency and the highest resonance frequency,
a plurality of the parallel resonators each of which is configured by the acoustic wave resonator, wherein
for the resonance frequency of the area having the lowest resonance frequency, a ratio of a difference between the minimum value and the maximum value among the plurality of parallel resonators relative to an intermediate value between these minimum value and maximum value is larger than a ratio of a difference between the minimum value and the maximum value among the plurality of parallel resonators relative to an intermediate value between these minimum value and maximum value for the resonance frequency of the area having the highest resonance frequency.

16. A communication apparatus, comprising:
an antenna,
a multiplexer, comprising:
an antenna terminal,
a transmission filter filtering a transmission signal and outputting the result to the antenna terminal, and
a receiving filter filtering a reception signal from the antenna terminal, wherein
at least one of the transmission filter and an acoustic wave filter comprising:
one or more serial resonators and one or more parallel resonators which are connected in a ladder form, wherein
at least one of the one or more parallel resonators is configured by an acoustic wave resonator, wherein the acoustic wave resonator, comprising:

a piezoelectric substrate,
an IDT electrode comprising pluralities of electrode fingers aligned in a direction of propagation of an acoustic wave on the piezoelectric substrate, and
a pair of reflectors on two sides of the pluralities of electrode fingers on the piezoelectric substrate in the direction of propagation, wherein
the IDT electrode further comprising a plurality of areas, a plurality of electrode fingers among the pluralities of electrode fingers being distributed to each of the areas, the areas having resonance frequencies different from each other,
the plurality of areas comprise at least an area having a lowest resonance frequency among all areas, an area having a highest resonance frequency among all of the areas, and an area having a resonance frequency which is higher than the lowest resonance frequency and is second highest among all of the areas,
the second highest resonance frequency is lower than an intermediate value between the lowest resonance frequency and the highest resonance frequency,
a plurality of the parallel resonators each of which is configured by the acoustic wave resonator, wherein
for the resonance frequency of the area having the lowest resonance frequency, a ratio of a difference between the minimum value and the maximum value among the plurality of parallel resonators relative to an intermediate value between these minimum value and maximum value is larger than a ratio of a difference between the minimum value and the maximum value among the plurality of parallel resonators relative to an intermediate value between these minimum value and maximum value for the resonance frequency of the area having the highest resonance frequency.

\* \* \* \* \*